(12) United States Patent
Hoshi et al.

(10) Patent No.: US 12,543,398 B2
(45) Date of Patent: Feb. 3, 2026

(54) IMAGING DEVICE

(71) Applicant: SONY SEMICONDUCTOR SOLUTIONS CORPORATION, Kanagawa (JP)

(72) Inventors: Hironori Hoshi, Kanagawa (JP); Atsushi Masagaki, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 519 days.

(21) Appl. No.: 17/766,833

(22) PCT Filed: Apr. 23, 2020

(86) PCT No.: PCT/JP2020/017538
§ 371 (c)(1),
(2) Date: Apr. 6, 2022

(87) PCT Pub. No.: WO2021/075077
PCT Pub. Date: Apr. 22, 2021

(65) Prior Publication Data
US 2024/0088189 A1    Mar. 14, 2024

(30) Foreign Application Priority Data
Oct. 15, 2019    (JP) .................................. 2019-188723

(51) Int. Cl.
*H10F 39/00*    (2025.01)
*H10F 39/18*    (2025.01)

(52) U.S. Cl.
CPC .......... *H10F 39/811* (2025.01); *H10F 39/011* (2025.01); *H10F 39/182* (2025.01); *H10F 39/8057* (2025.01); *H10F 39/807* (2025.01)

(58) Field of Classification Search
CPC ......... H01L 27/14636; H01L 27/14623; H01L 27/1463; H01L 27/14645; H01L 27/14683
See application file for complete search history.

(56) References Cited

U.S. PATENT DOCUMENTS

2011/0019038 A1*   1/2011   Okuno ............ H01L 27/14609
                                                      348/E5.079
2011/0242386 A1   10/2011   Machida
(Continued)

FOREIGN PATENT DOCUMENTS

CN    102468314 A    5/2012
CN    103000644 A    3/2013
(Continued)

OTHER PUBLICATIONS

International Search Report prepared by the European Patent Office on Jul. 15, 2020, for International Application No. PCT/JP2020/017538, 6 pgs.
(Continued)

*Primary Examiner* — Jay C Kim
*Assistant Examiner* — Woo K Lee
(74) *Attorney, Agent, or Firm* — Sheridan Ross PC

(57) ABSTRACT

To provide an imaging device capable of further suppressing noise in a pixel signal. An imaging device includes: a semiconductor substrate (30) that includes a photoelectric conversion portion (31) configured to photoelectrically convert incident light, or a charge holding portion (32) configured to hold charge photoelectrically converted by the photoelectric conversion portion; a field effect transistor provided on the photoelectric conversion portion, or on the semiconductor substrate near the charge holding portion; a contact plug (26) that extends in a direction normal to one main surface of the semiconductor substrate from a gate electrode (25) of the field effect transistor; and a projecting portion (27) that extends in an in-plane direction of the one main surface of the semiconductor substrate from the contact plug.

13 Claims, 28 Drawing Sheets

(56) References Cited

U.S. PATENT DOCUMENTS

| | | |
|---|---|---|
| 2012/0300106 A1 | 11/2012 | Kobayashi et al. |
| 2013/0200479 A1 | 8/2013 | Sakano |
| 2015/0009388 A1 | 1/2015 | Kobayashi et al. |
| 2016/0043125 A1* | 2/2016 | Hatano .................. H10K 19/20 257/432 |
| 2016/0086993 A1 | 3/2016 | Kobayashi et al. |
| 2017/0098676 A1 | 4/2017 | Kobayashi et al. |
| 2018/0130840 A1 | 5/2018 | Kobayashi et al. |
| 2019/0181167 A1 | 6/2019 | Yeo |
| 2020/0321376 A1* | 10/2020 | Noudo .................. H10F 39/199 |

FOREIGN PATENT DOCUMENTS

| | | |
|---|---|---|
| CN | 110313067 A | 10/2019 |
| JP | S59198755 A | 11/1984 |
| JP | H11135629 A | 5/1999 |
| JP | 2001015725 A | 1/2001 |
| JP | 2005005573 A | 1/2005 |
| JP | 2005236013 A | 9/2005 |
| JP | 2010045083 A | 2/2010 |
| JP | 2011029835 A | 2/2011 |
| JP | 2011151420 A | 8/2011 |
| JP | 2011-216970 | 10/2011 |
| JP | 2011233589 A | 11/2011 |
| JP | 2013065688 A | 4/2013 |
| JP | 2014203961 A | 10/2014 |
| JP | 2015041677 A | 3/2015 |
| JP | 2015228510 A | 12/2015 |
| JP | 2016039315 A | 3/2016 |
| JP | 2018011059 A | 1/2018 |
| JP | 2018088488 A | 6/2018 |
| JP | 2019125784 A | 7/2019 |
| JP | 2021064711 A | 4/2021 |
| WO | WO-2017169505 A1 | 10/2017 |
| WO | WO-2018008614 A1 | 1/2018 |

OTHER PUBLICATIONS

Written Opinion prepared by the European Patent Office on Jul. 15, 2020, for International Application No. PCT/JP2020/017538, 10 pgs.

* cited by examiner

[Fig. 1]

[Fig. 3]
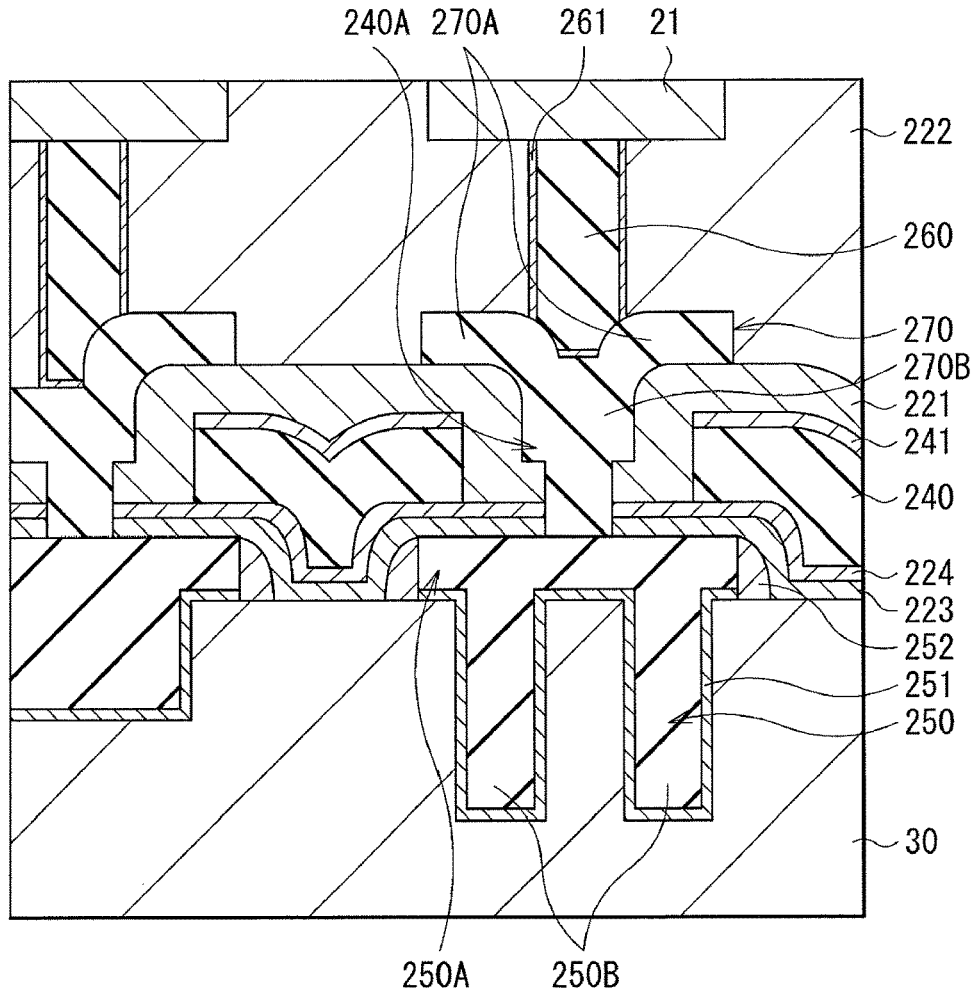
[Fig. 4A]
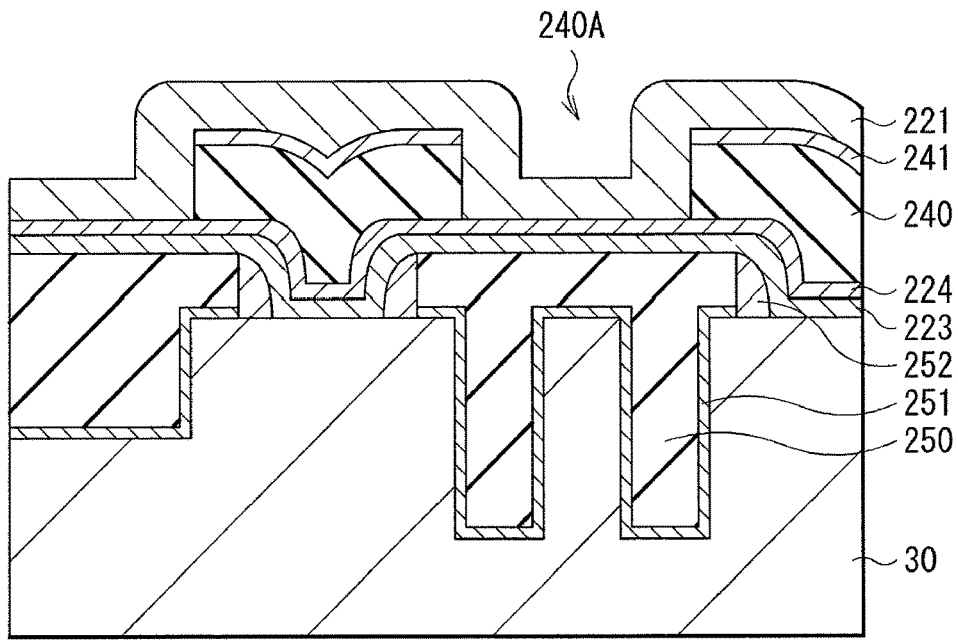

[Fig. 4B]
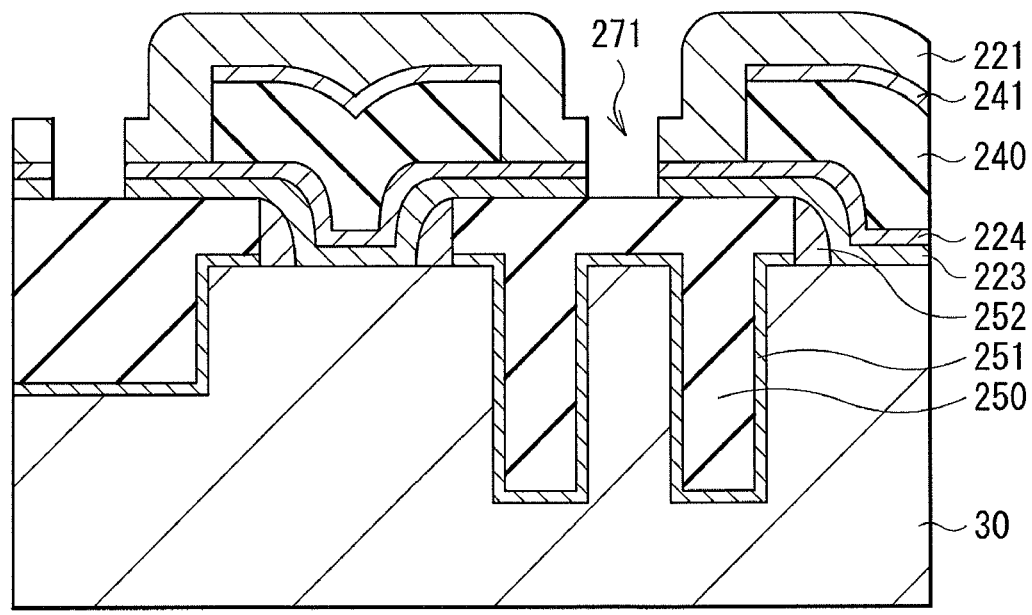
[Fig. 4C]
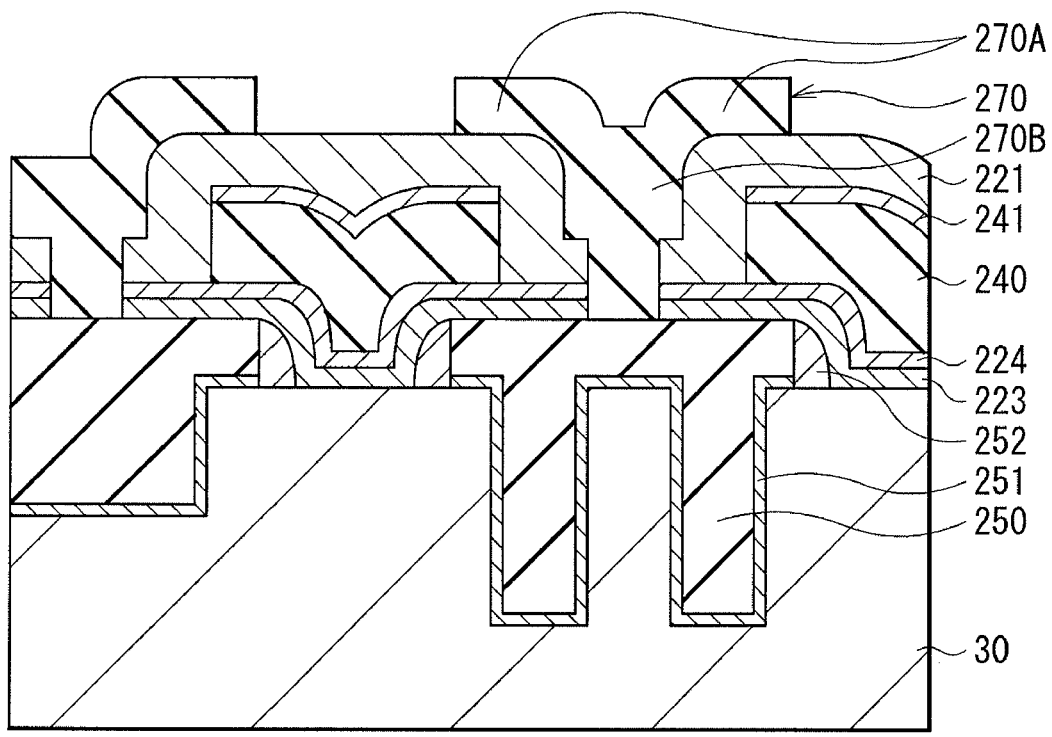

[Fig. 4D]
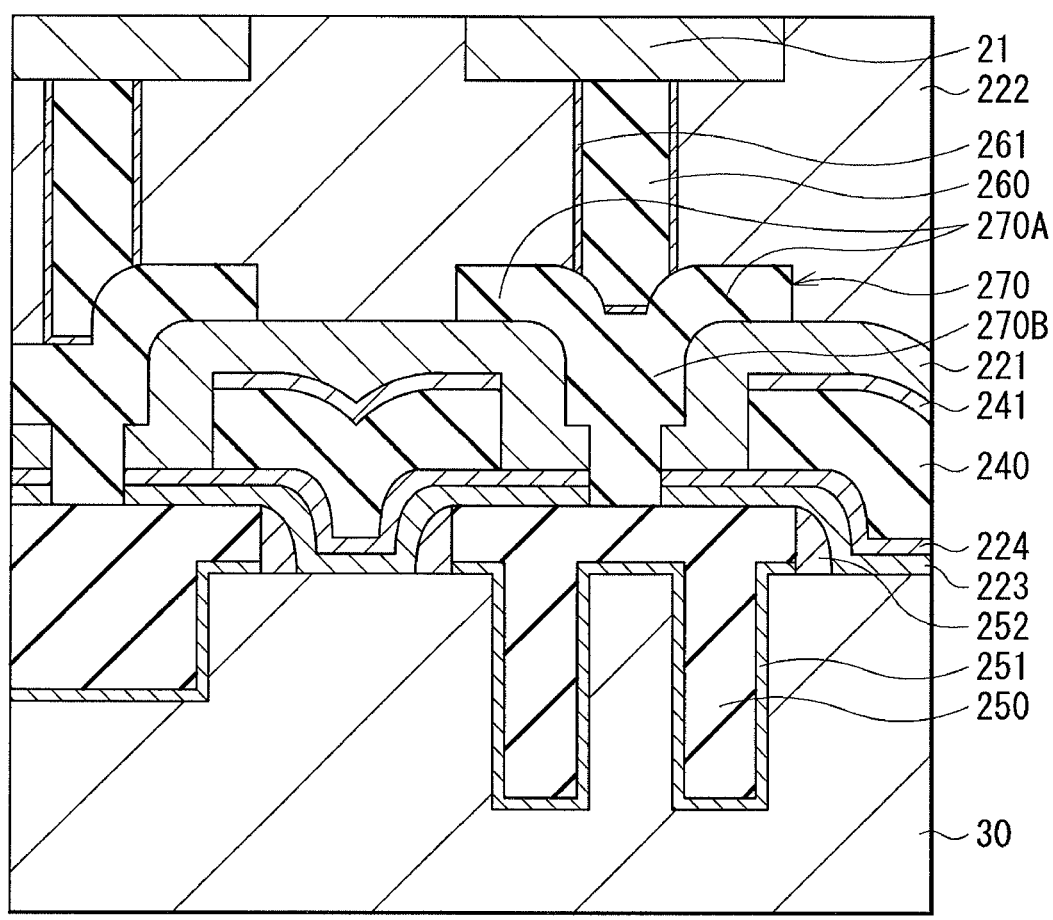

[Fig. 5]
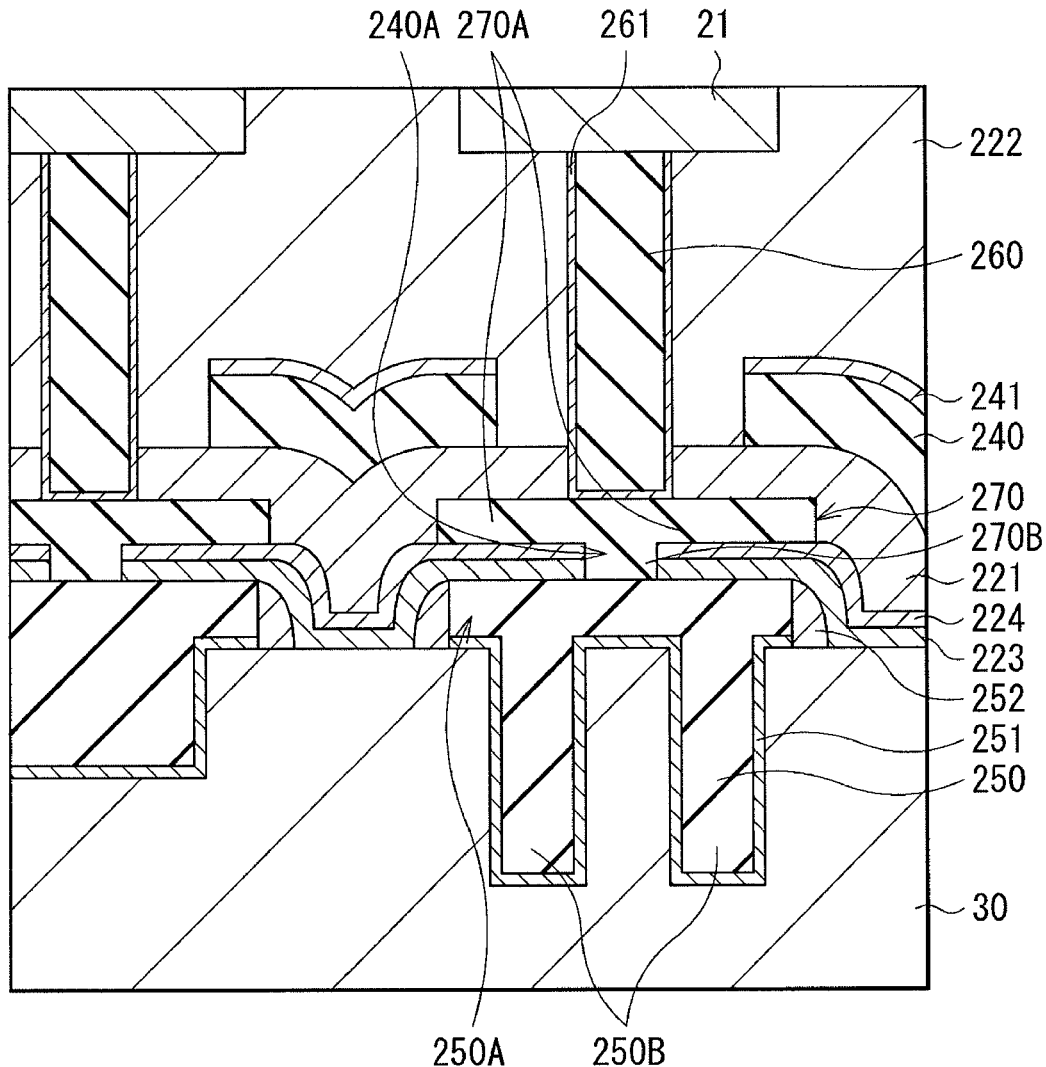
[Fig. 6A]
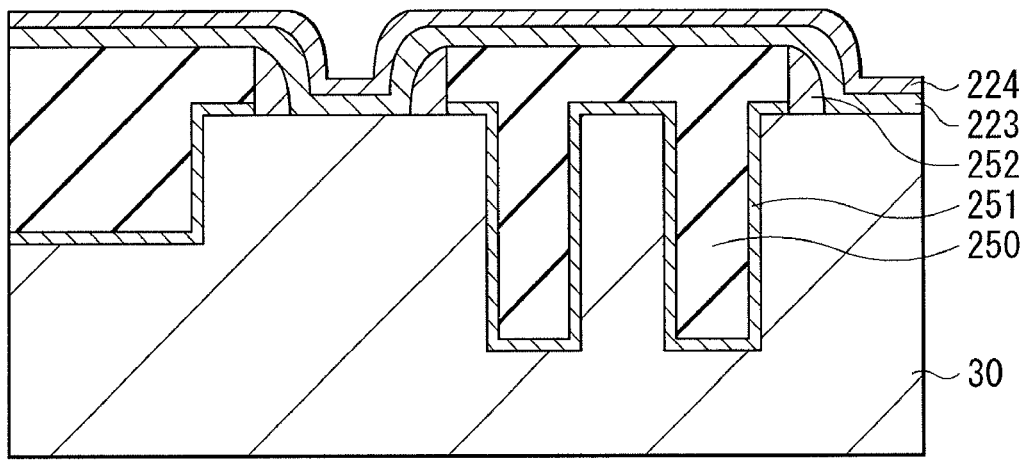

[Fig. 6B]
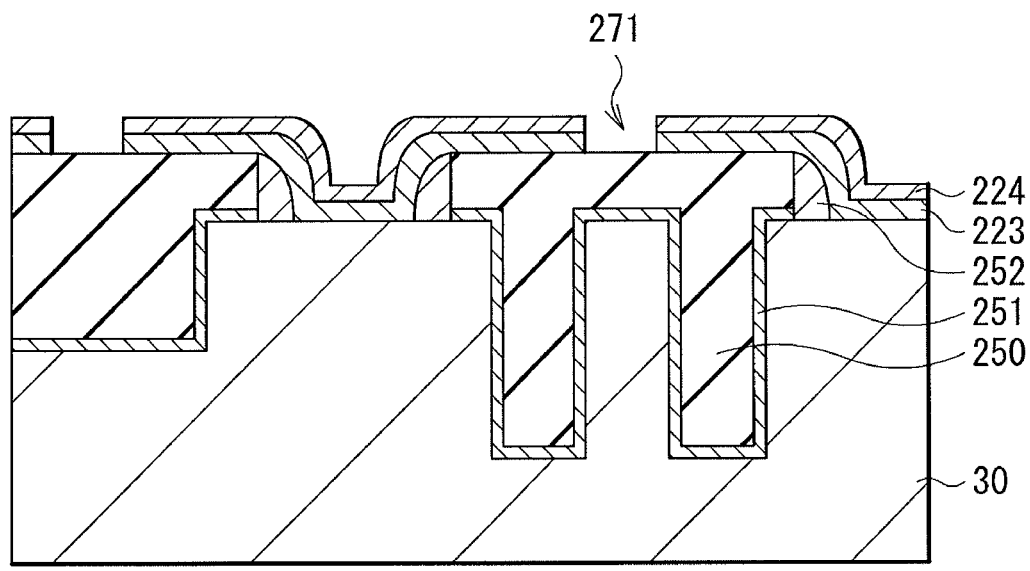
[Fig. 6C]
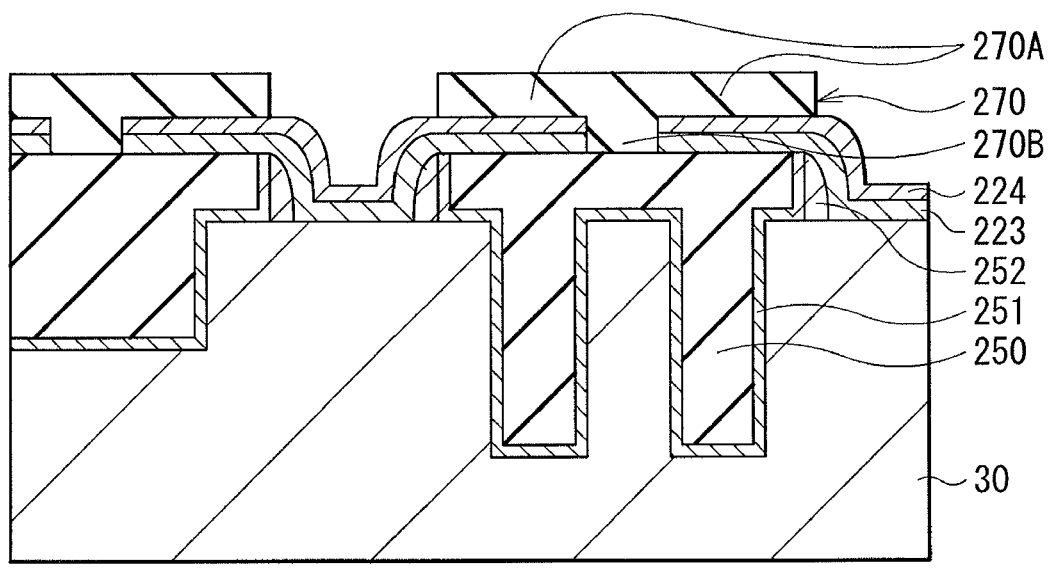

[Fig. 6D]
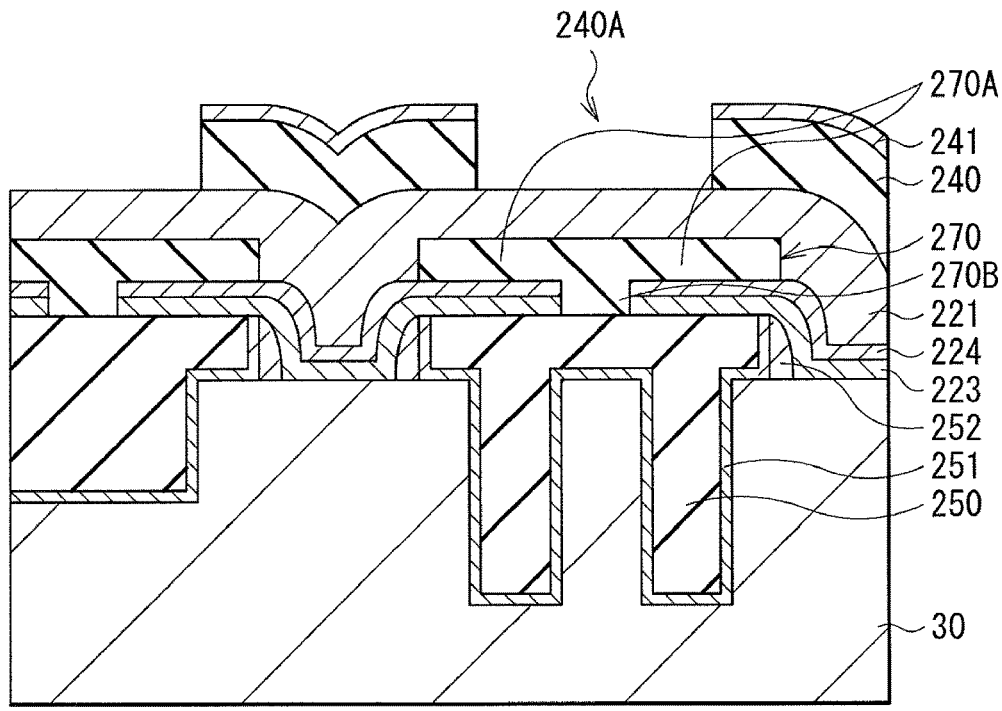
[Fig. 6E]
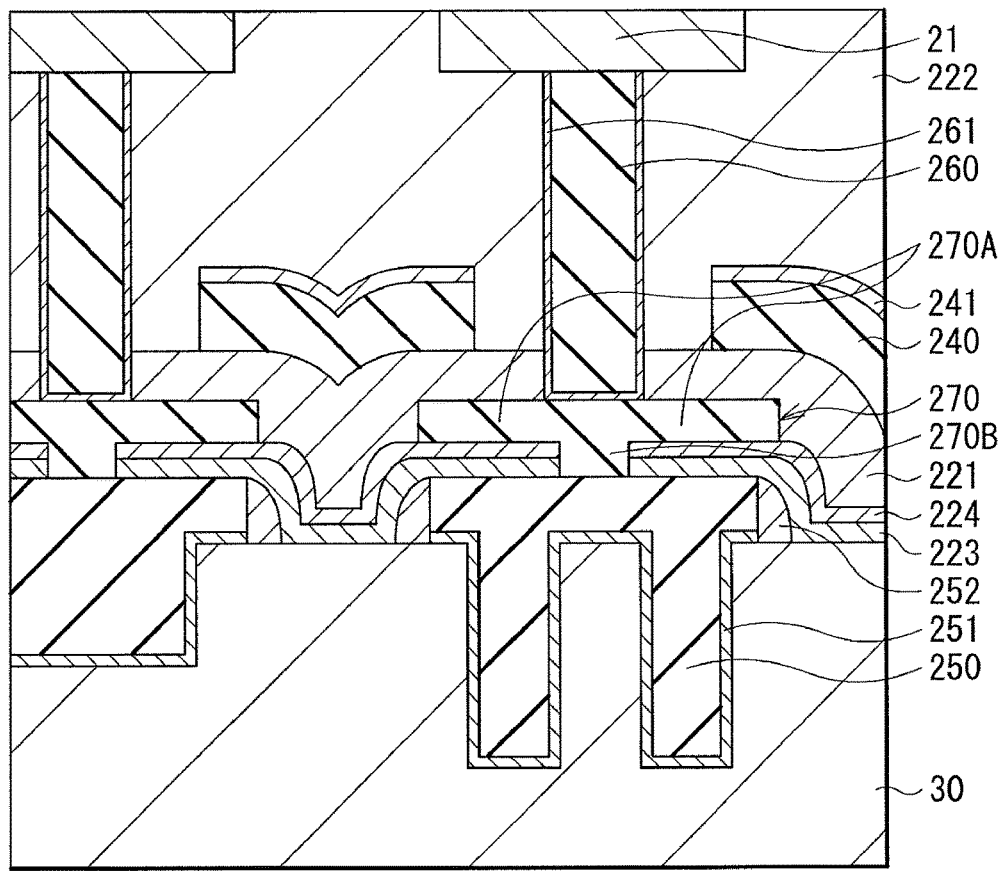

[Fig. 7]
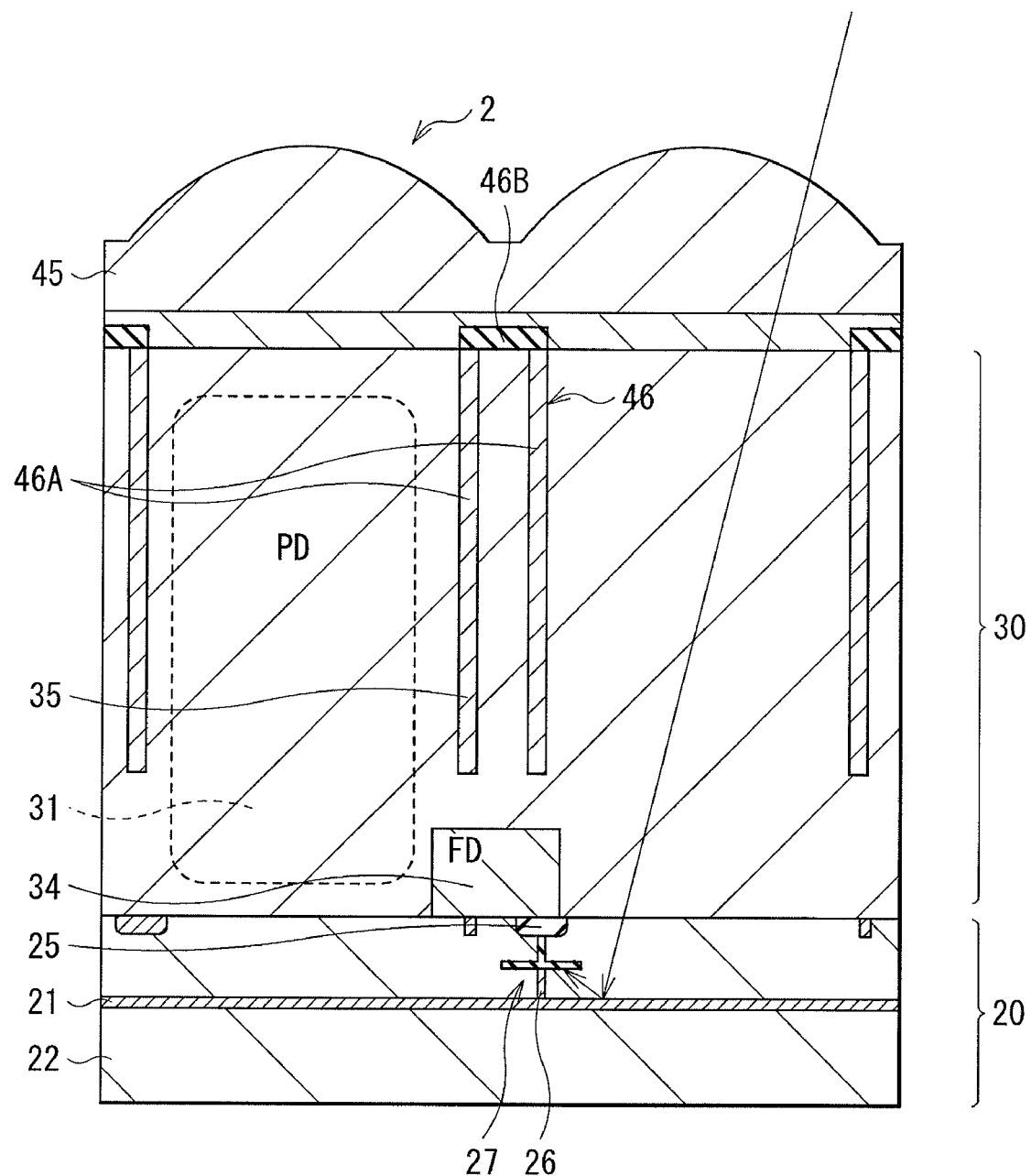

[Fig. 8]
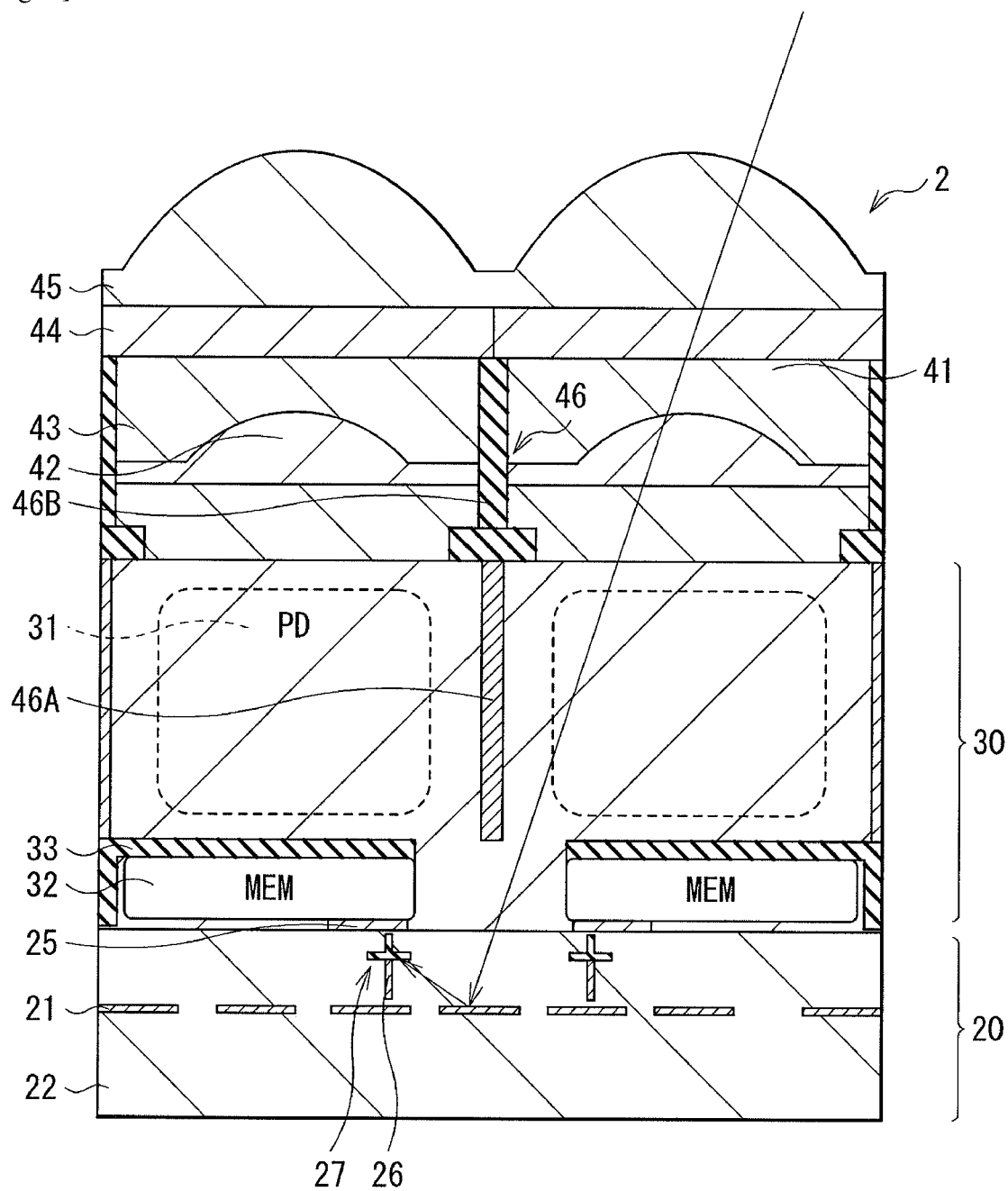

[Fig. 9]
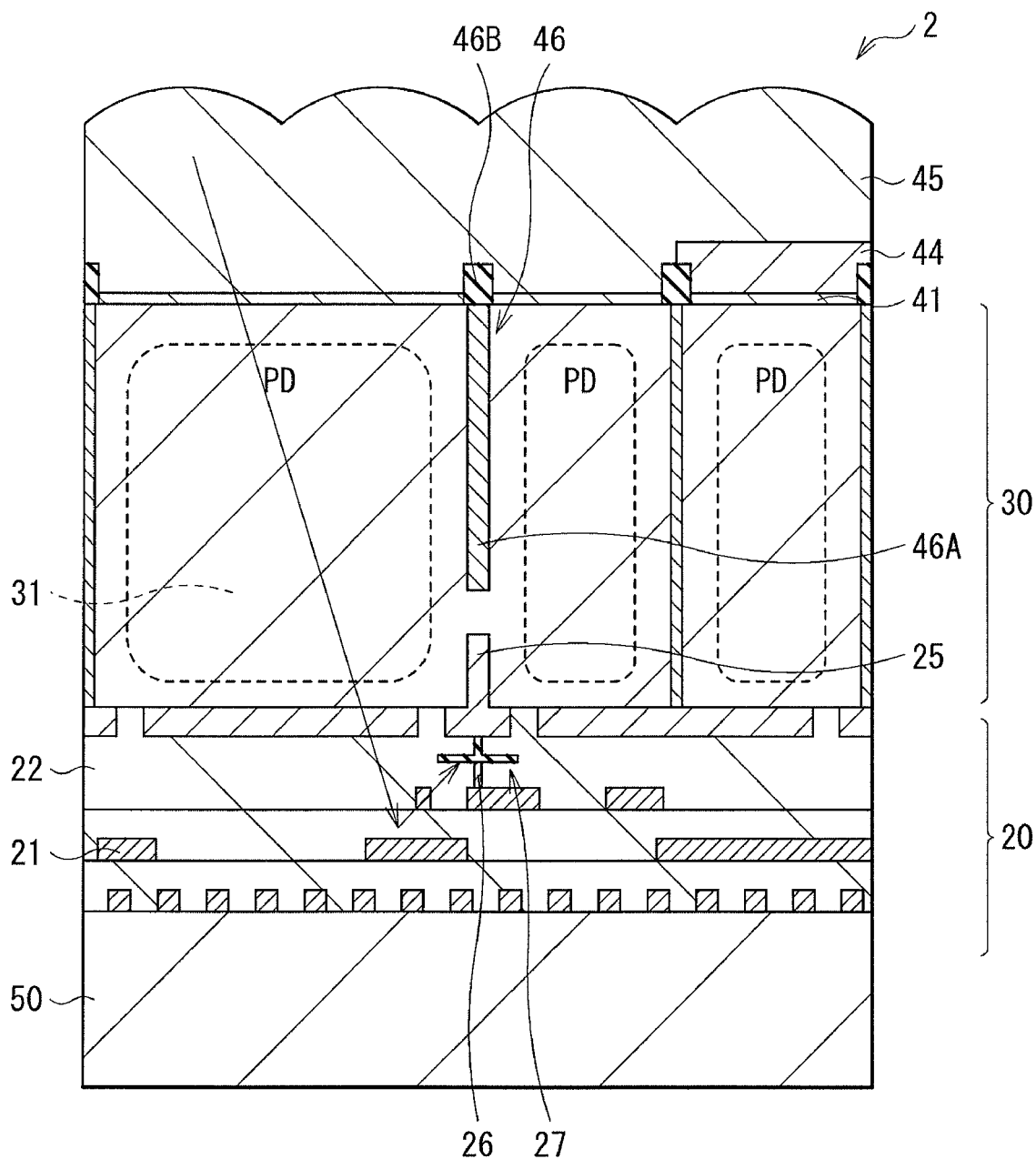

[Fig. 10]
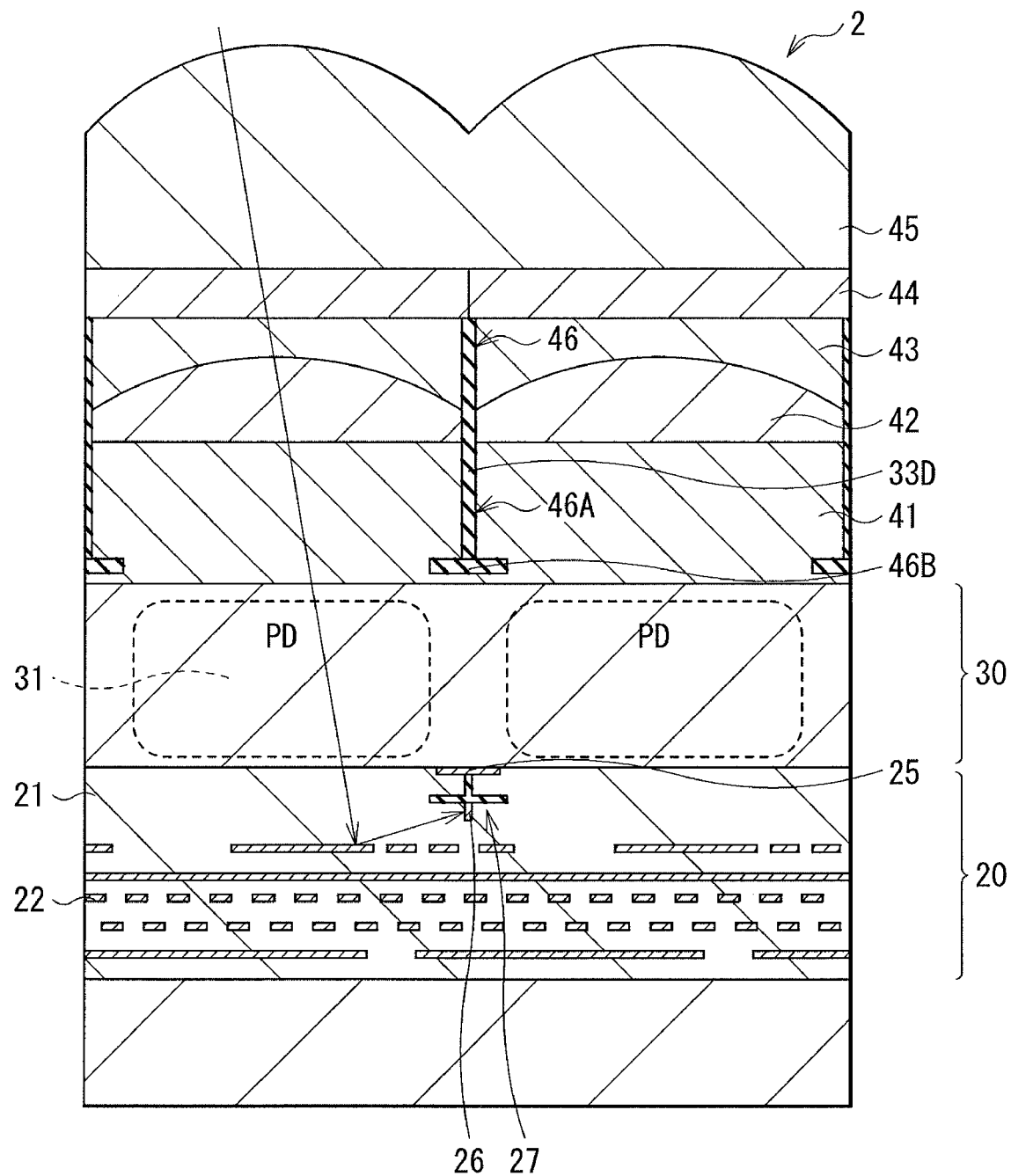

[Fig. 11]
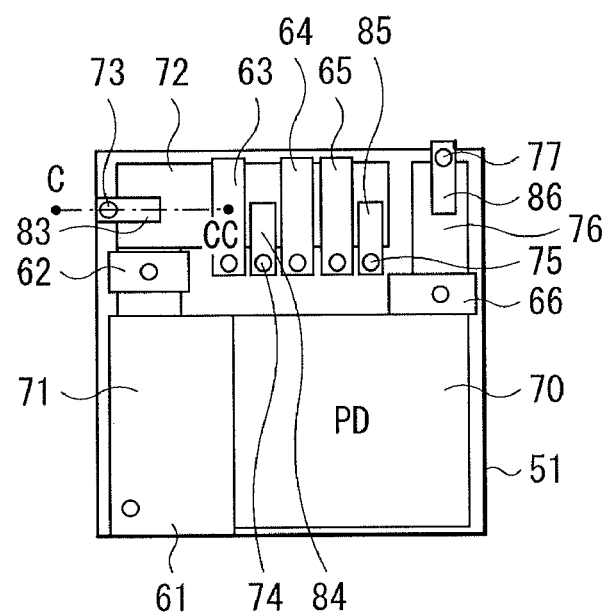
[Fig. 12]
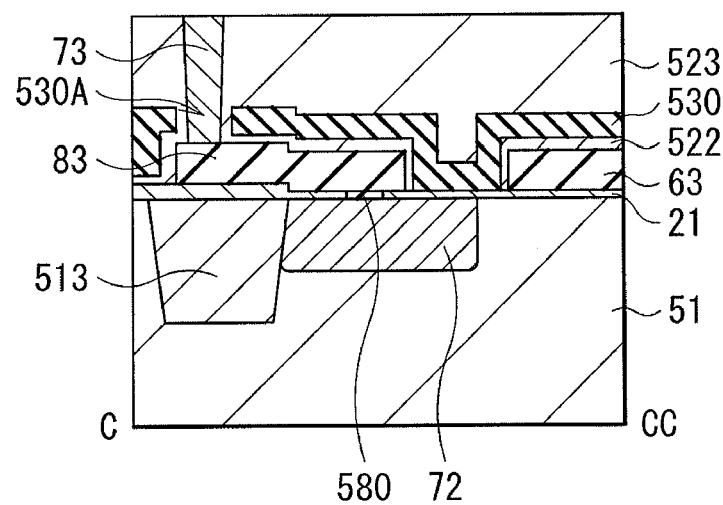

[Fig. 13]
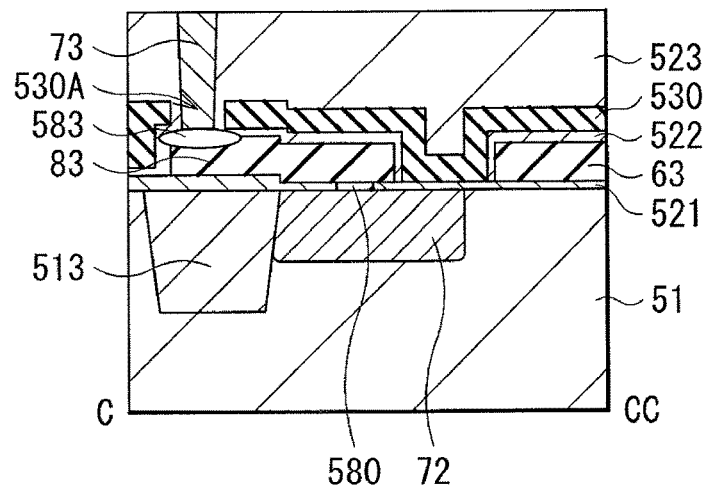
[Fig. 14A]
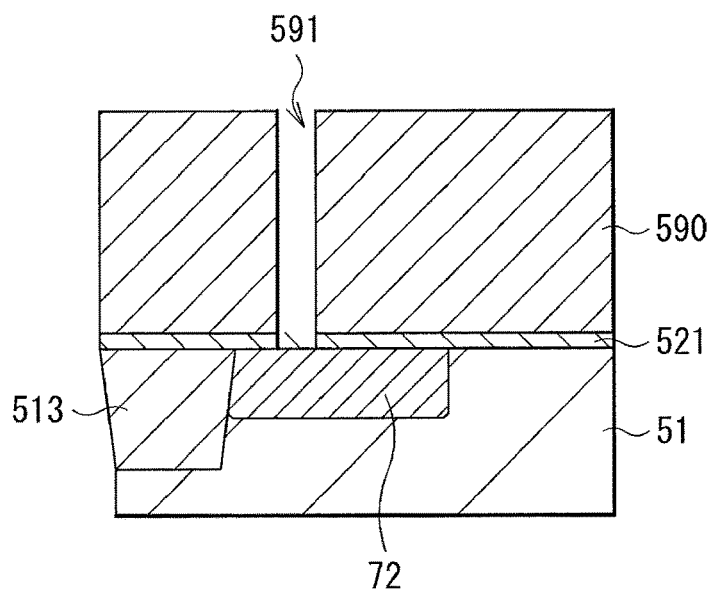
[Fig. 14B]
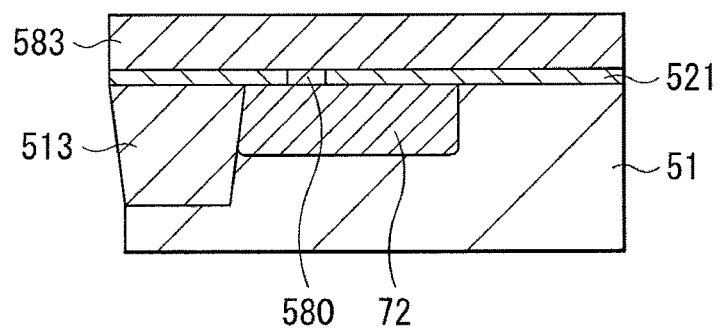

[Fig. 14C]
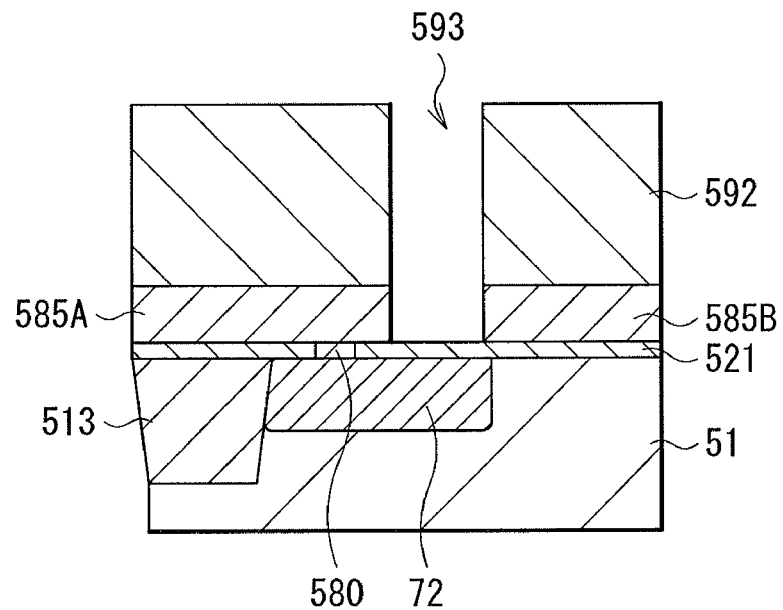
[Fig. 14D]
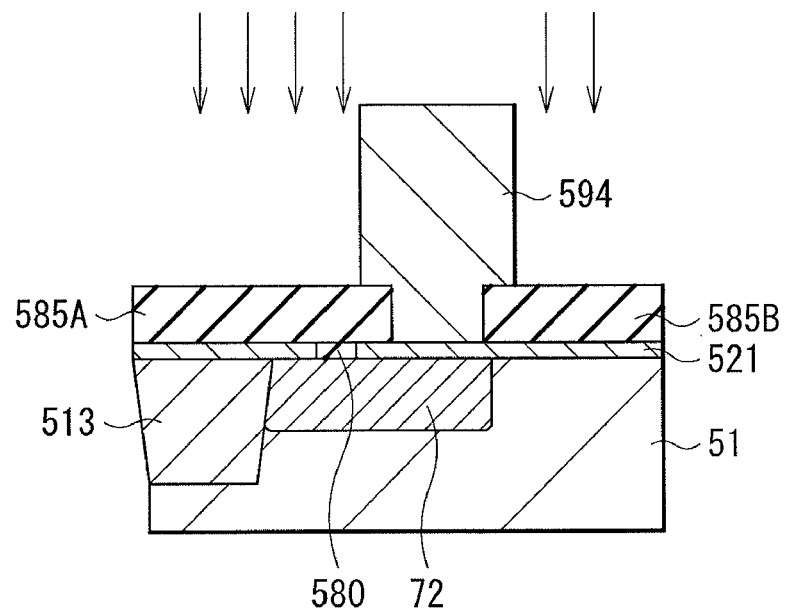

[Fig. 14E]
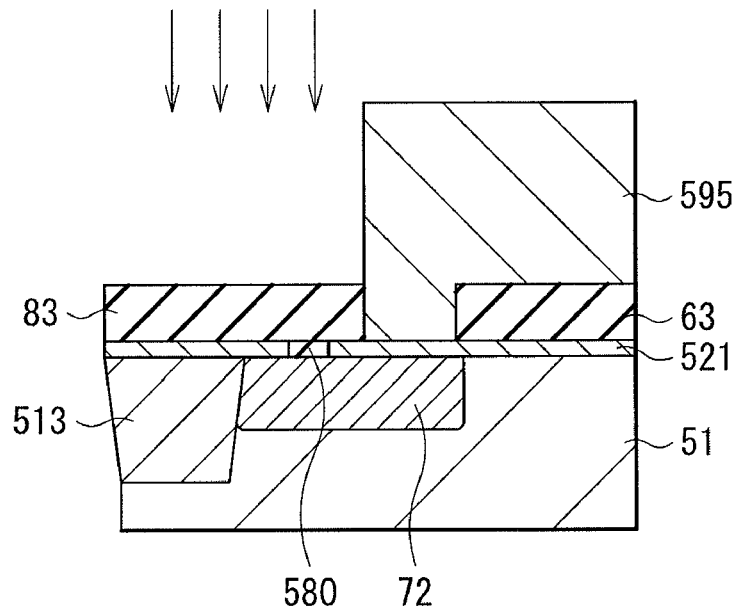
[Fig. 14F]
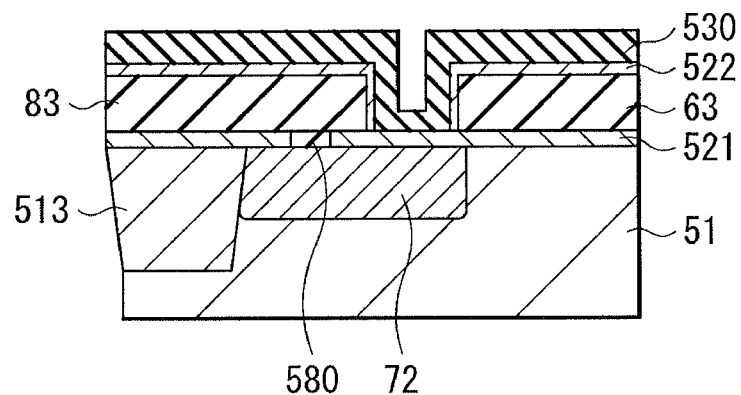

[Fig. 14G]
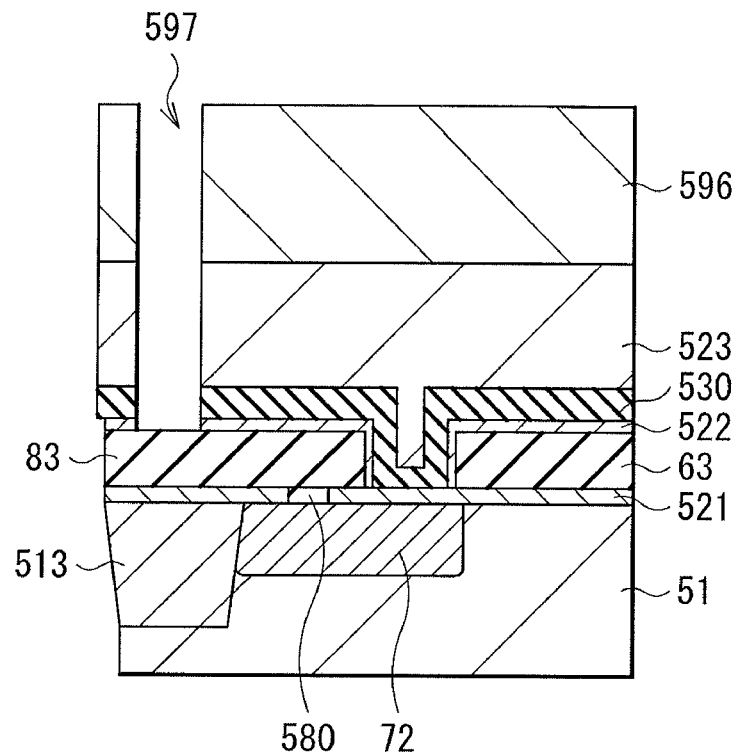
[Fig. 14H]
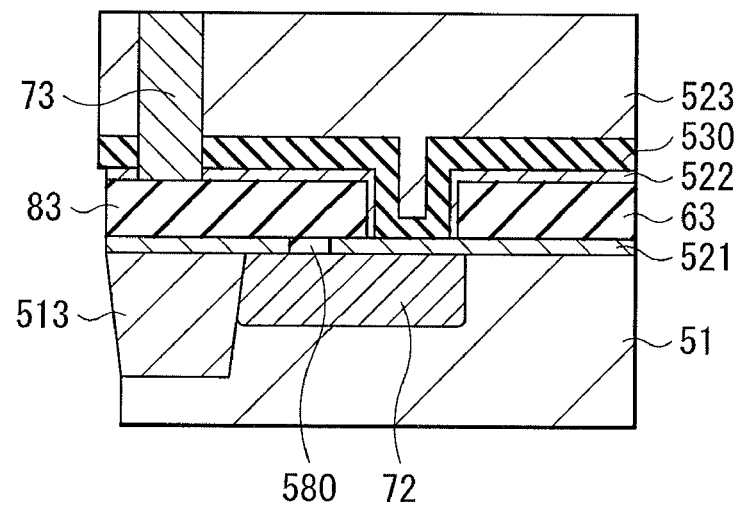

[Fig. 15A]
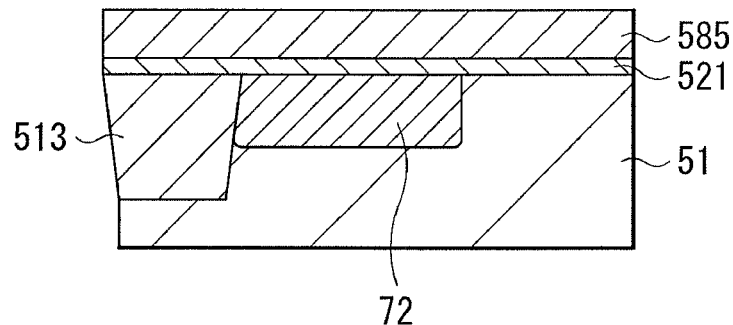
[Fig. 15B]
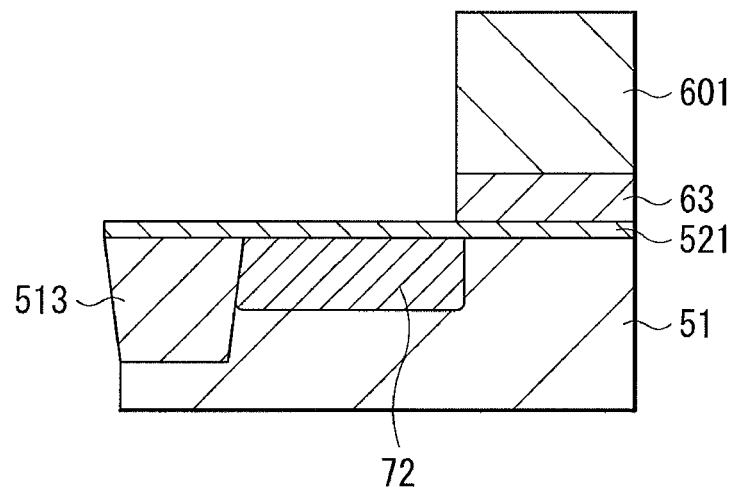
[Fig. 15C]
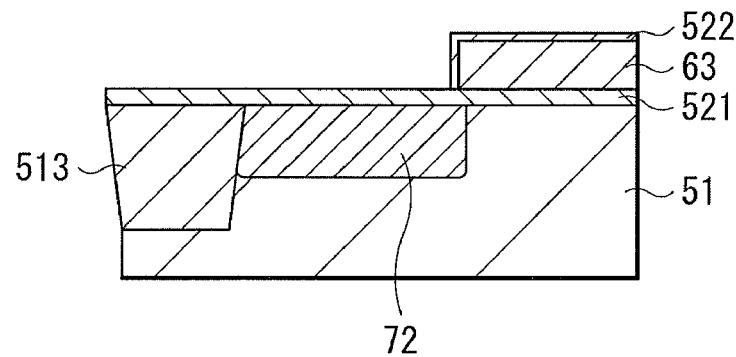

[Fig. 15D]
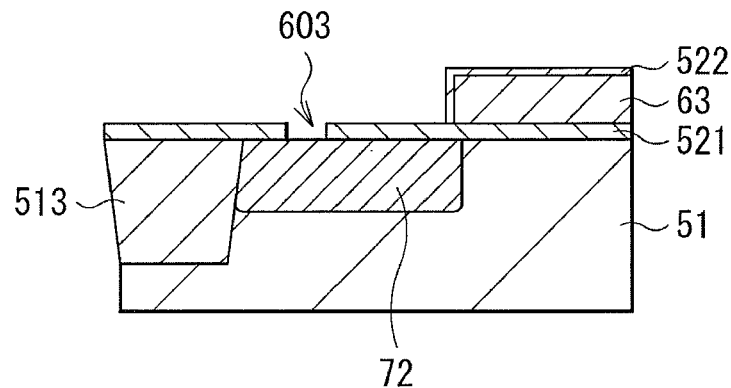
[Fig. 15E]
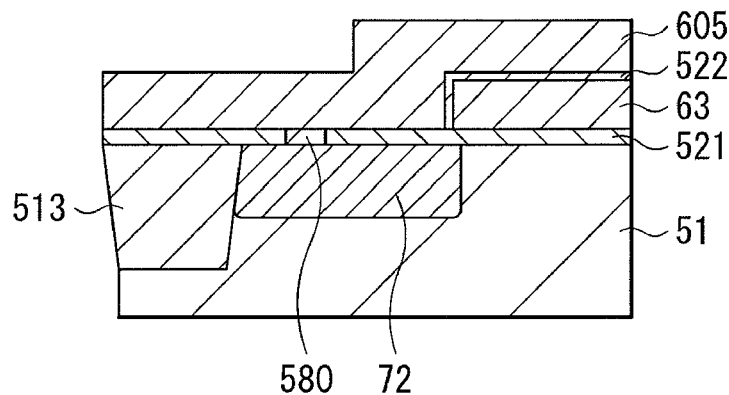
[Fig. 15F]
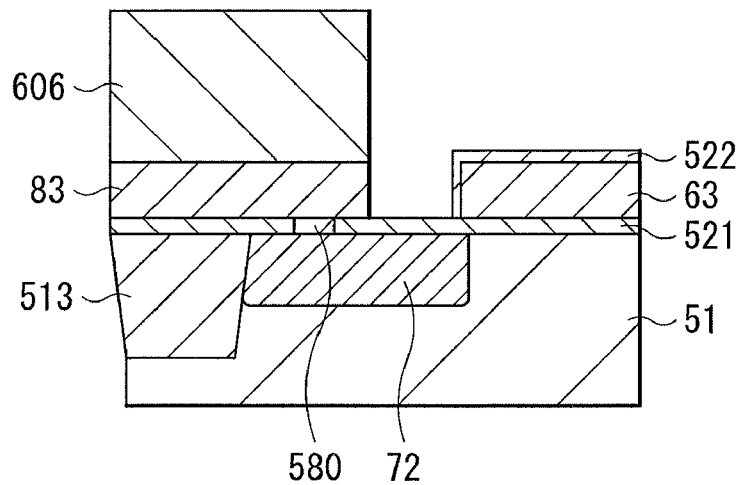

[Fig. 16]
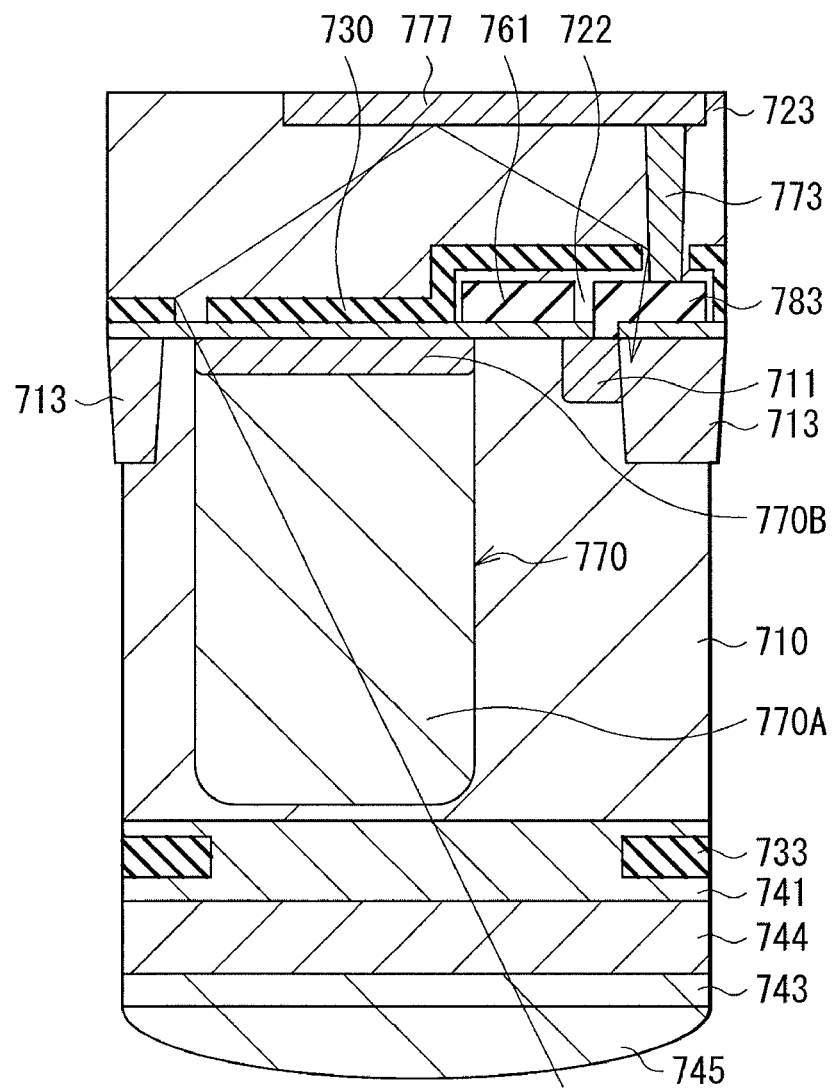

[Fig. 17]
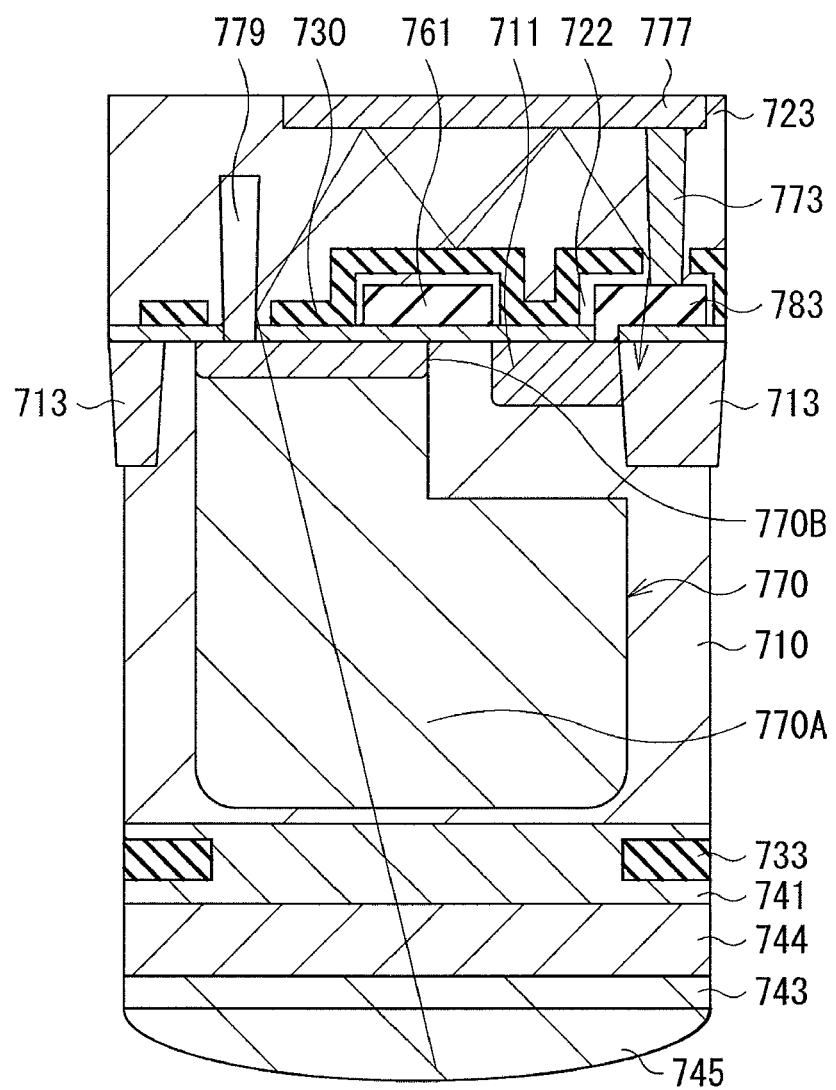

[Fig. 18]
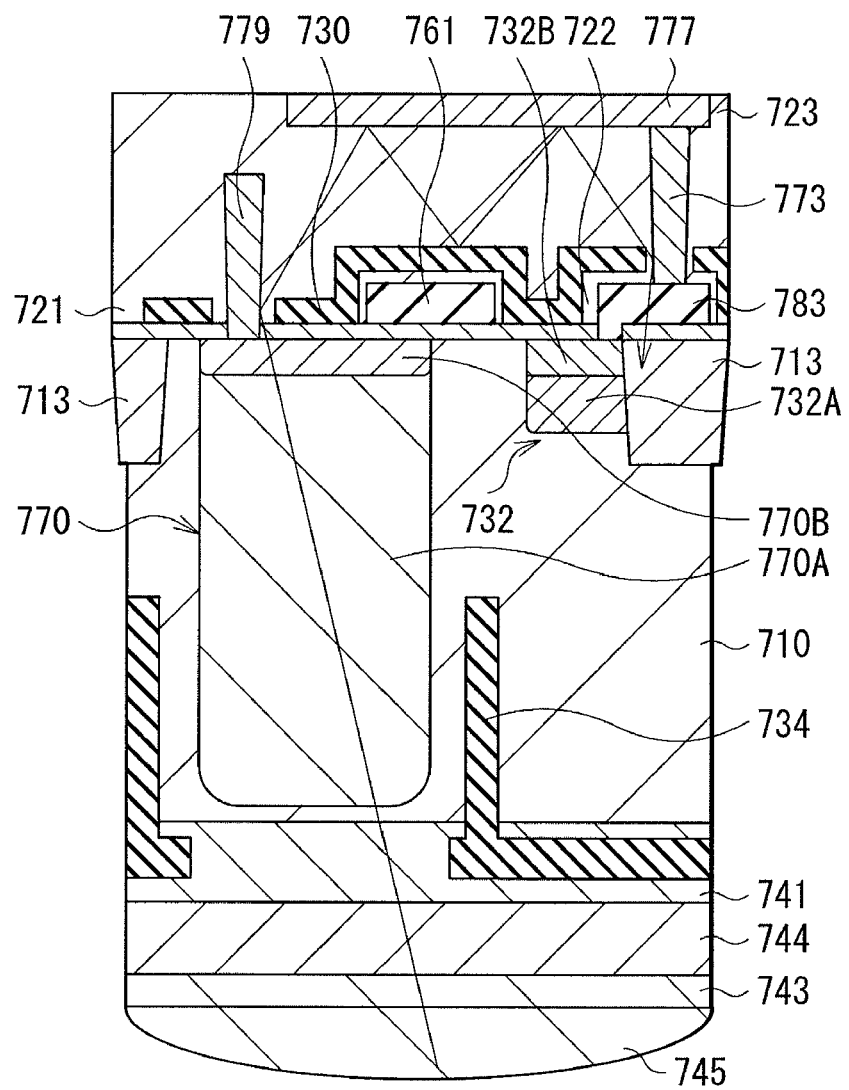

[Fig. 20]
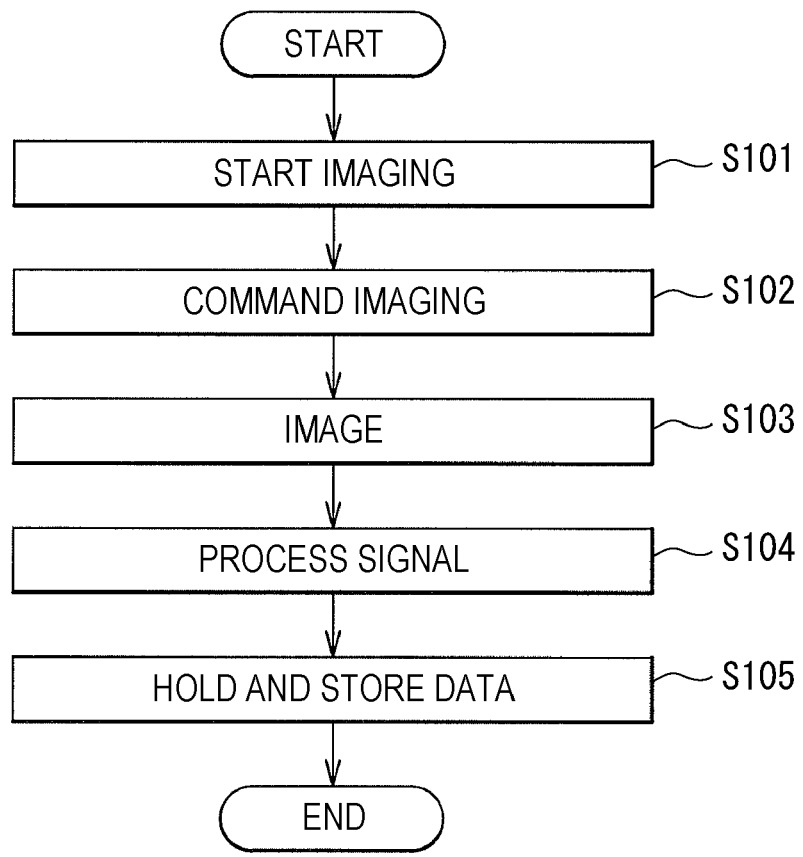

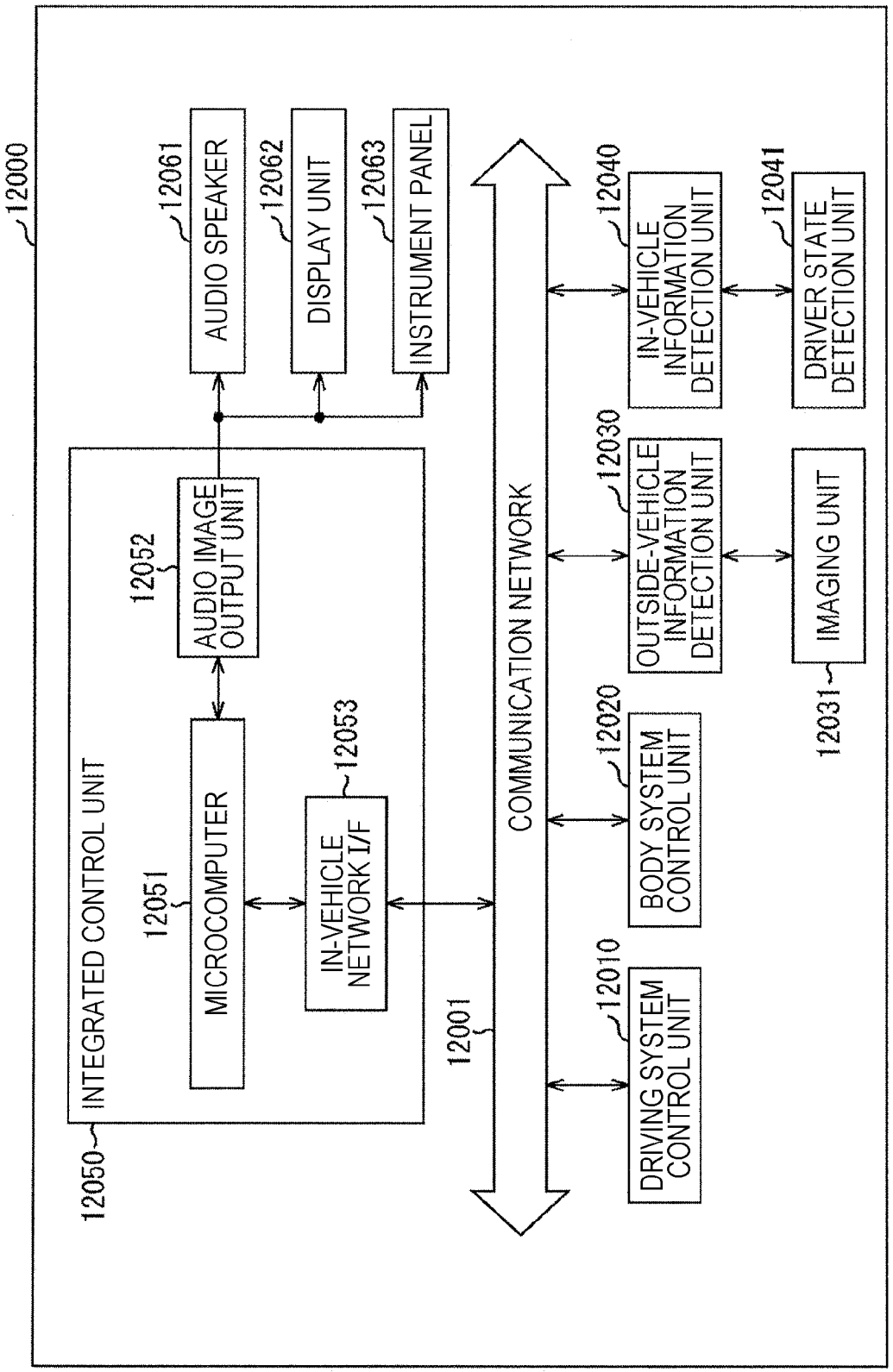

[Fig. 22]
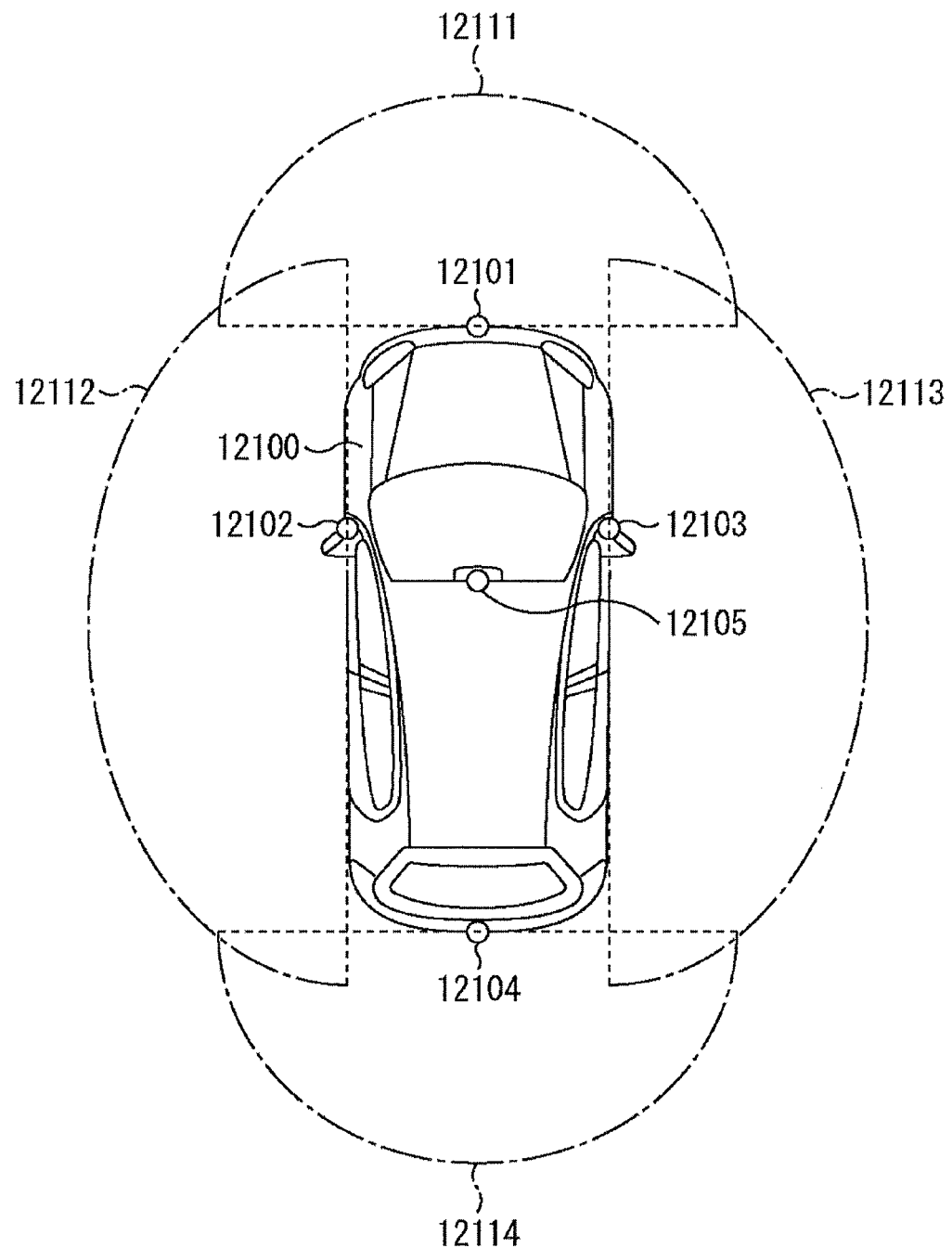

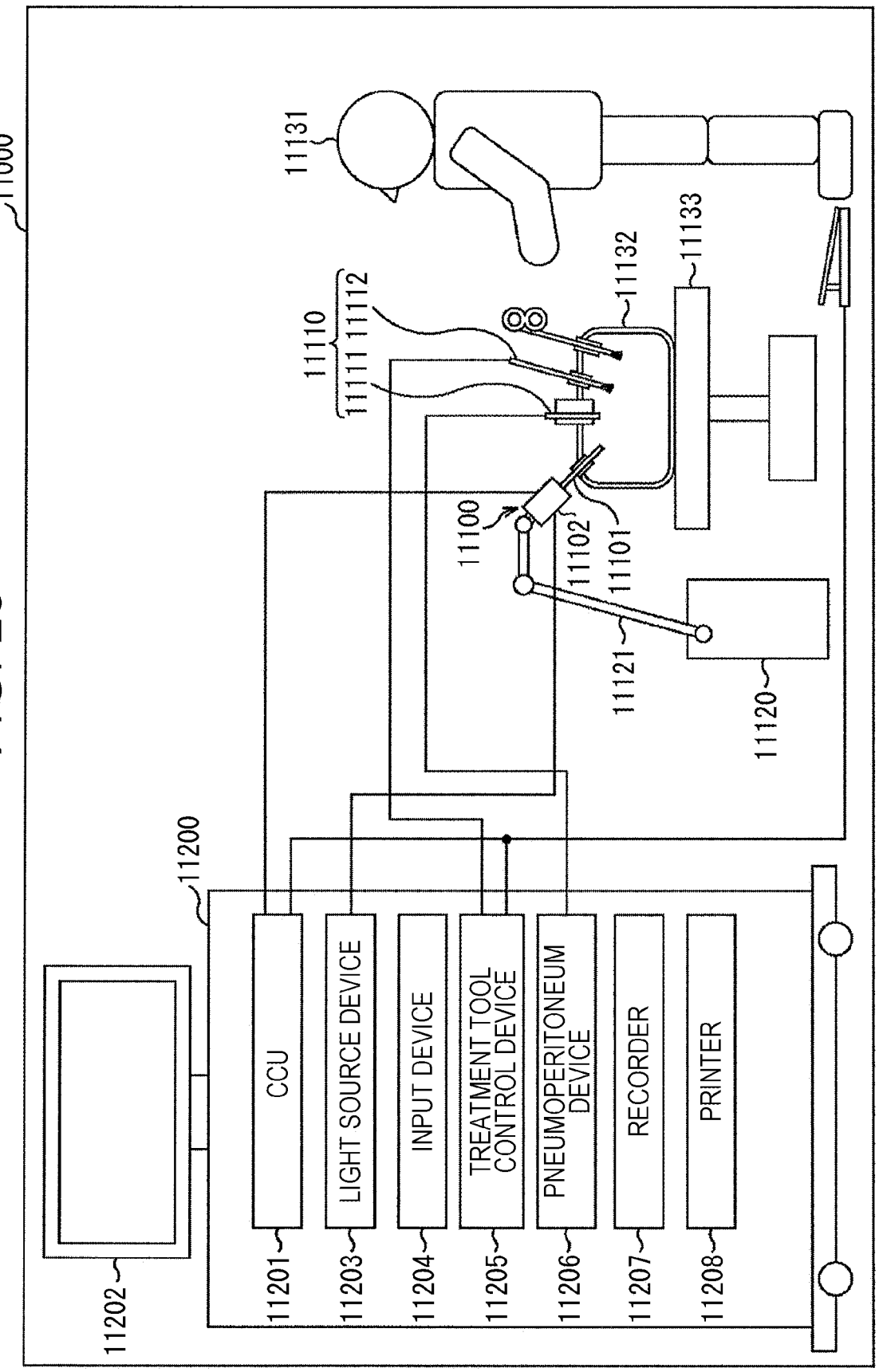

[Fig. 24]
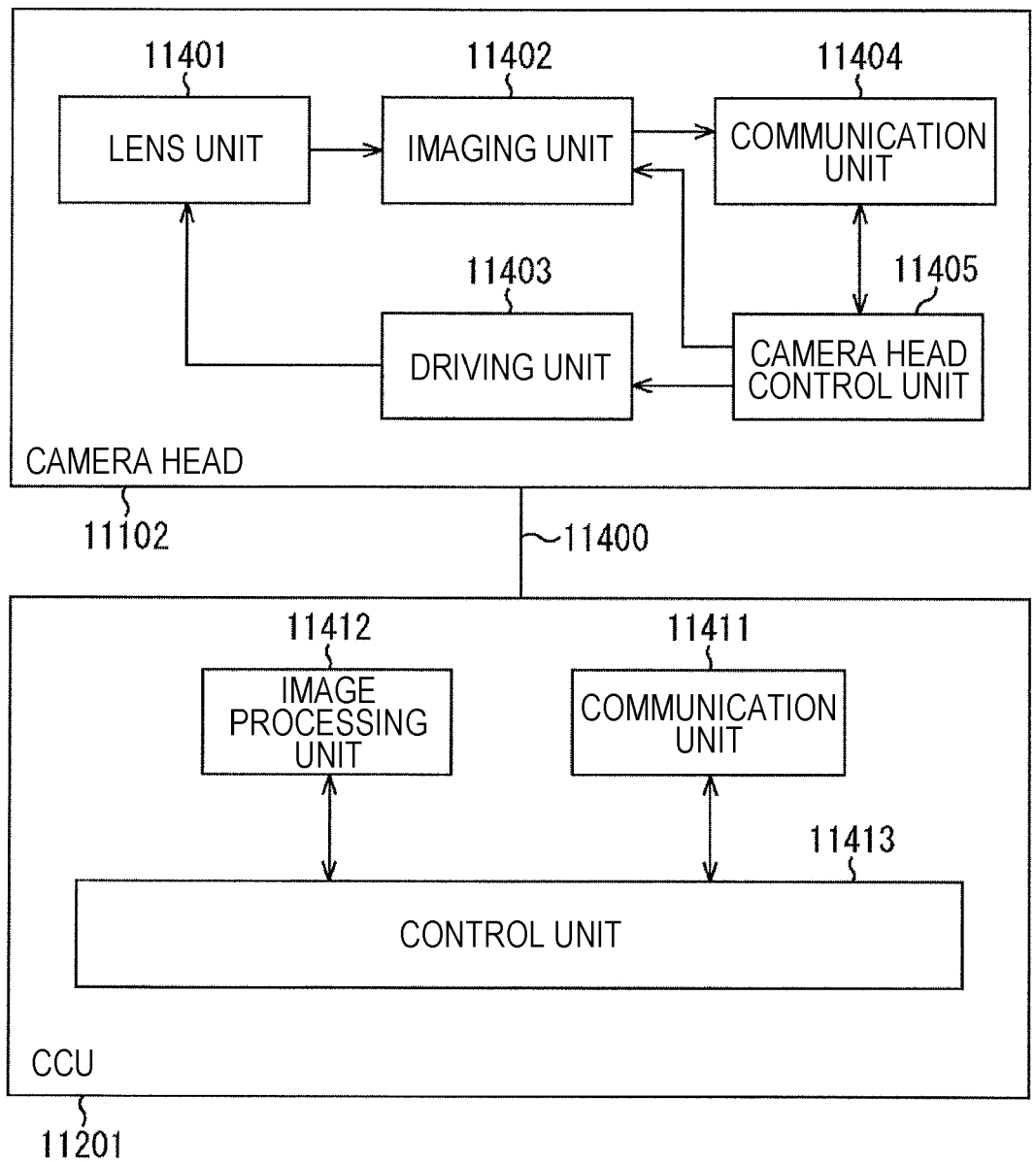

IMAGING DEVICE

CROSS REFERENCE TO RELATED APPLICATIONS

This application is a national stage application under 35 U.S.C. 371 and claims the benefit of PCT Application No. PCT/JP2020/017538, having an international filing date of 23 Apr. 2020, which designated the United States, which PCT application claimed the benefit of Japanese Priority Patent Application JP 2019-188723, filed 15 Oct. 2019, the entire disclosures of each of which are incorporated herein by reference.

TECHNICAL FIELD

The present disclosure relates to an imaging device.

BACKGROUND ART

Sensitivity of an imaging device has been more and more improving in recent years. Accordingly, an effect of crosstalk between adjacent pixels caused by reflection of light inside the imaging device has been also increasing.

It has therefore been proposed to provide a light-shielding film inside the imaging device to suppress stray light inside the imaging device (for example, Patent Literature 1).

CITATION LIST

Patent Literature

PTL 1: JP 2011-216970A

SUMMARY

Technical Problem

It is thus desired to more effectively shield light reflected inside an imaging device so that charge other than charge generated by light from an object is not generated by the reflection light inside.

Accordingly, it is desirable to provide an imaging device capable of further suppressing noise in a pixel signal.

Solution to Problem

An imaging device according to an embodiment of the present disclosure includes: a semiconductor substrate that includes a photoelectric conversion portion configured to photoelectrically convert incident light, or a charge holding portion configured to hold charge photoelectrically converted by the photoelectric conversion portion; a field effect transistor provided on the photoelectric conversion portion, or on the semiconductor substrate near the charge holding portion; a contact plug that extends in a direction normal to one main surface of the semiconductor substrate from a gate electrode of the field effect transistor; and a projecting portion that extends in an in-plane direction of the one main surface of the semiconductor substrate from the contact plug.

An imaging device according to an embodiment of the present disclosure includes: a semiconductor substrate that includes a photoelectric conversion portion configured to photoelectrically convert incident light, a charge holding portion configured to accumulate charge photoelectrically converted by the photoelectric conversion portion, and a reading circuit configured to read the charge; a light-shielding layer provided on one main surface of the semiconductor substrate; a contact that penetrates the light-shielding layer and extends in a direction normal to the one main surface of the semiconductor substrate; and a contact wiring layer that electrically connects the contact and a source or a drain of a field effect transistor provided on the semiconductor substrate. The one main surface of the semiconductor substrate includes a charge accumulation region that includes at least the photoelectric conversion portion and the charge holding portion, and a non-charge accumulation region that includes the reading circuit. The contact wiring layer extends to the non-charge accumulation region, and is electrically connected to the contact in the non-charge accumulation region.

The imaging device according to an embodiment of the present disclosure can more efficiently shield entrance of reflection light into the photoelectric conversion portion, the charge holding portion, or the like. In this manner, the imaging device according to an embodiment of the present disclosure can suppress generation of new charge caused by reflection light inside, for example.

BRIEF DESCRIPTION OF DRAWINGS

FIG. 3 is a longitudinal cross-sectional view showing a first configuration example of a projecting portion according to the same embodiment.

FIG. 4A is a longitudinal cross-sectional view explaining a step of a forming method of the projecting portion according to the first configuration example.

FIG. 4B is a longitudinal cross-sectional view explaining a step of the forming method of the projecting portion according to the first configuration example.

FIG. 4C is a longitudinal cross-sectional view explaining a step of the forming method of the projecting portion according to the first configuration example.

FIG. 4D is a longitudinal cross-sectional view explaining a step of the forming method of the projecting portion according to the first configuration example.

FIG. 5 is a longitudinal cross-sectional view showing a second configuration example of the projecting portion according to the same embodiment.

FIG. 6A is a longitudinal cross-sectional view explaining a step of a forming method of the projecting portion according to the second configuration example.

FIG. 6B is a longitudinal cross-sectional view explaining a step of the forming method of the projecting portion according to the second configuration example.

FIG. 6C is a longitudinal cross-sectional view explaining a step of the forming method of the projecting portion according to the second configuration example.

FIG. 6D is a longitudinal cross-sectional view explaining a step of the forming method of the projecting portion according to the second configuration example.

FIG. 6E is a longitudinal cross-sectional view explaining a step of the forming method of the projecting portion according to the second configuration example.

FIG. 7 is a longitudinal cross-sectional view showing an example of an imaging device to which the technology according to the same embodiment is applicable.

FIG. 8 is a longitudinal cross-sectional view showing an example of an imaging device to which the technology according to the same embodiment is applicable.

FIG. 9 is a longitudinal cross-sectional view showing an example of an imaging device to which the technology according to the same embodiment is applicable.

FIG. 10 is a longitudinal cross-sectional view showing an example of an imaging device to which the technology according to the same embodiment is applicable.

FIG. 11 is a plan view showing an example of a pixel of an imaging device according to a second embodiment of the present disclosure.

FIG. 12 is a longitudinal cross-sectional view showing a sectional structure taken along a cutting line C-CC in FIG. 11.

FIG. 13 is a longitudinal cross-sectional view showing a modification of the sectional structure shown in FIG. 12.

FIG. 14A is a longitudinal cross-sectional view explaining a step of a first forming method of a contact wiring layer.

FIG. 14B is a longitudinal cross-sectional view explaining a step of the first forming method of the contact wiring layer.

FIG. 14C is a longitudinal cross-sectional view explaining a step of the first forming method of the contact wiring layer.

FIG. 14D is a longitudinal cross-sectional view explaining a step of the first forming method of the contact wiring layer.

FIG. 14E is a longitudinal cross-sectional view explaining a step of the first forming method of the contact wiring layer.

FIG. 14F is a longitudinal cross-sectional view explaining a step of the first forming method of the contact wiring layer.

FIG. 14G is a longitudinal cross-sectional view explaining a step of the first forming method of the contact wiring layer.

FIG. 14H is a longitudinal cross-sectional view explaining a step of the first forming method of the contact wiring layer.

FIG. 15A is a longitudinal cross-sectional view explaining a step of a second forming method of the contact wiring layer.

FIG. 15B is a longitudinal cross-sectional view explaining a step of the second forming method of the contact wiring layer.

FIG. 15C is a longitudinal cross-sectional view explaining a step of the second forming method of the contact wiring layer.

FIG. 15D is a longitudinal cross-sectional view explaining a step of the second forming method of the contact wiring layer.

FIG. 15E is a longitudinal cross-sectional view explaining a step of the second forming method of the contact wiring layer.

FIG. 15F is a longitudinal cross-sectional view explaining a step of the second forming method of the contact wiring layer.

FIG. 16 is a longitudinal cross-sectional view showing an example of an imaging device to which the technology according to the same embodiment is applicable.

FIG. 17 is a longitudinal cross-sectional view showing an example of an imaging device to which the technology according to the same embodiment is applicable.

FIG. 18 is a longitudinal cross-sectional view showing an example of an imaging device to which the technology according to the same embodiment is applicable.

FIG. 20 shows an example of a flowchart of an imaging operation performed by the imaging system shown in FIG. 19.

FIG. 21 is a block diagram showing an example of a schematic configuration of a vehicle control system.

FIG. 22 is an explanatory view showing an example of installation positions of an outside-vehicle information detection unit and an imaging unit.

FIG. 23 is a diagram showing an example of a schematic configuration of an endoscopic surgery system.

FIG. 24 is a block diagram showing an example of functional configurations of a camera head and a CCU.

DESCRIPTION OF EMBODIMENTS

Embodiments according to the present disclosure will be hereinafter described in detail with reference to the drawings. The embodiments described below are specific examples of the present disclosure. The technology according to the present disclosure is not limited to the following modes. In addition, arrangement, dimensions, dimensional ratios, and the like of respective constituent elements shown in the respective figures of the present disclosure are not limited to those shown in the respective figures.

Note that the description will be presented in the following order.

Figure 1:
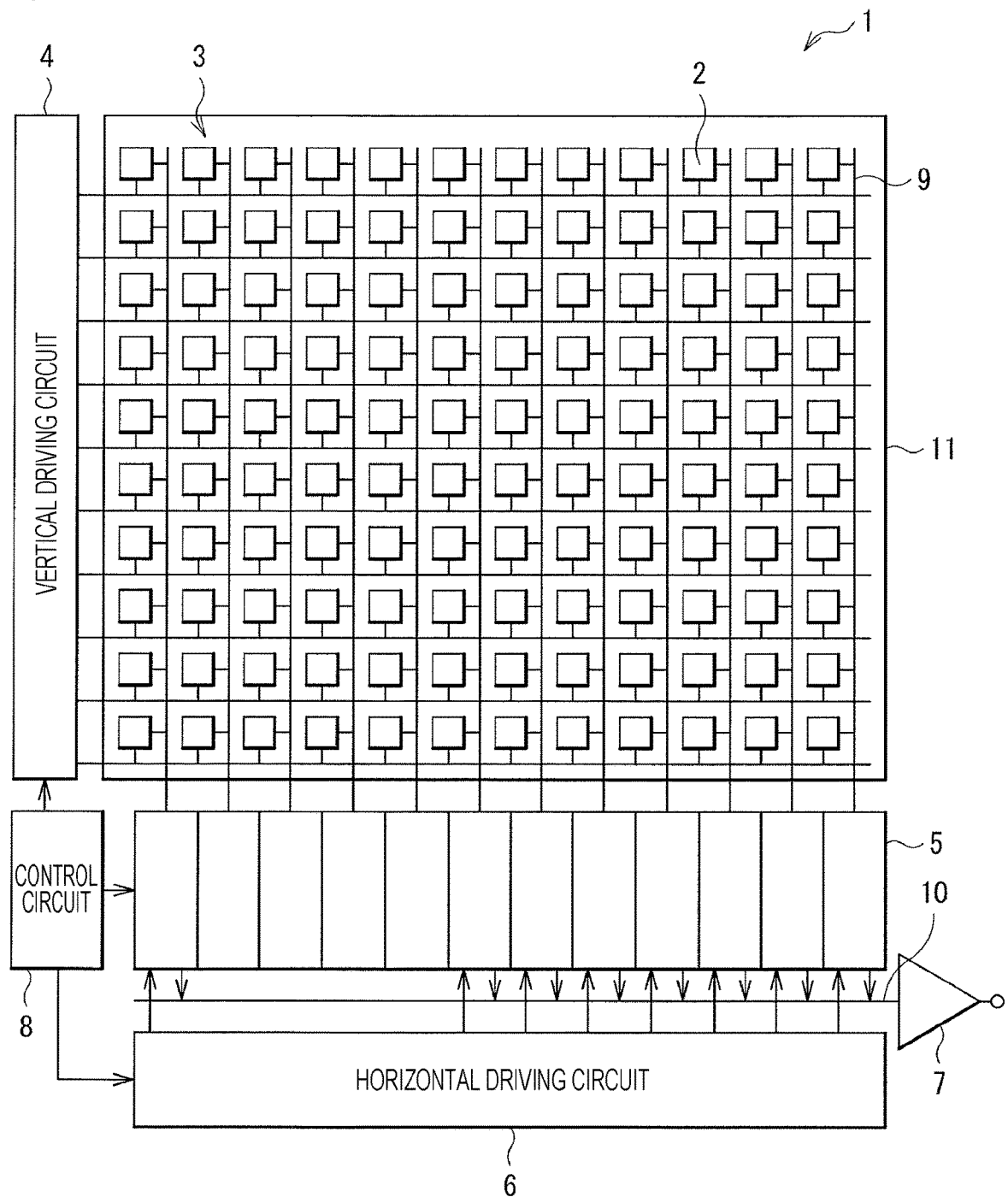
FIG. 1 is a schematic explanatory diagram explaining an overall configuration of an imaging device to which the technology according to the present disclosure is applied.

1. Overall configuration of imaging device
2. First Embodiment
2.1. Pixel configuration
2.2. Configuration example of projecting portion
2.3. Modifications
3. Second Embodiment
3.1. Pixel configuration
3.2. Configuration example of contact wiring layer
3.3. Forming method of contact wiring layer
3.4. Modifications
4. Application examples 1. Overall Configuration of Imaging Device Initially described with reference to FIG. 1 will be an overall configuration of an imaging device to which the technology according to the present disclosure is applied. FIG. 1 is a schematic explanatory diagram explaining the overall configuration of the imaging device to which the technology according to the present disclosure is applied.

As shown in FIG. 1, an imaging device 1 to which the technology according to the present disclosure is applied includes a pixel array unit 3 in which pixels 2 are two-dimensionally arranged in a matrix, a vertical driving circuit 4, column signal processing circuits 5, a horizontal driving circuit 6, an output circuit 7, and a control circuit 8, for example.

The pixel array unit 3, the vertical driving circuit 4, the column signal processing circuits 5, the horizontal driving circuit 6, the output circuit 7, and the control circuit 8 are provided on a semiconductor substrate such as silicon (Si), for example. The pixel array unit 3, the vertical driving circuit 4, the column signal processing circuits 5, the horizontal driving circuit 6, the output circuit 7, and the control circuit 8 may be provided on one semiconductor substrate, or may be divided into two or more groups and provided on two or more semiconductor substrates one for each semiconductor substrate.

Each of the pixels 2 includes a photoelectric conversion portion, and a pixel circuit which converts charge generated by the photoelectric conversion portion into a pixel signal.

The photoelectric conversion portion includes a photodiode, for example. The pixel circuit includes four metal-oxide-semiconductor field-effect transistors (MOSFETs) such as a transfer transistor, an amplification transistor, a selection transistor, and a reset transistor, for example.

Moreover, each of the pixels 2 may further include a charge holding portion to achieve a global shutter operation. The global shutter operation is a shutter operation which simultaneously starts exposure for all of the pixels 2 effective for imaging, and simultaneously ends the exposure. The charge holding portion is capable of temporarily holding charge photoelectrically converted by the exposure simultaneously performed for all the pixels until extraction of pixel signals from the respective pixels 2.

Note that the pixels 2 may be provided by a pixel sharing structure. The pixel sharing structure is a structure where some or all of the pixel circuits are shared by a plurality of the adjacent pixels 2. For example, the plurality of adjacent pixels 2 may share an amplification transistor, a selection transistor, and a reset transistor. In such a case, each of the plurality of adjacent pixels 2 includes a photodiode, a transfer transistor, one floating diffusion shared by the plurality of adjacent pixels 2, one amplification transistor similarly shared, one selection transistor similarly shared, and one reset transistor similarly shared.

The control circuit 8 controls operations of respective units of the imaging device 1. Specifically, the control circuit 8 generates a clock signal and a control signal which are references for operations of the vertical driving circuit 4, the column signal processing circuits 5, the horizontal driving circuit 6, and the like on the basis of a vertical synchronization signal, a horizontal synchronization signal, and a master clock. Moreover, the control circuit 8 outputs the generated clock signal and control signal to the vertical driving circuit 4, the column signal processing circuits 5, the horizontal driving circuit 6, and the like.

The vertical driving circuit 4 includes a shift register and the like, for example. The vertical driving circuit 4 selects a pixel drive wiring 10, and supplies a pulse signal to the selected pixel drive wiring 10 to drive the pixels 2 in units of row. Specifically, the vertical driving circuit 4 selectively scans each of the pixels 2 included in the pixel array unit 3 sequentially in the vertical direction in units of row. In this manner, the vertical driving circuit 4 can extract a pixel signal corresponding to an amount of photoelectrically converted charge from each of the pixels 2, and supply the pixel signal to the column signal processing circuits 5.

The column signal processing circuit 5 is provided for each column of the pixels 2 of the pixel array unit 3, and performs a noise removal process and the like for pixel signals output from the pixels 2 for each column of the pixels 2. For example, each of the column signal processing circuits 5 may perform correlated double sampling (CDS) processing for removing fixed pattern noise unique to the pixels 2, analog-digital (AD) conversion processing, and the like for the pixel signals.

The horizontal driving circuit 6 includes a shift register or the like, for example. The horizontal driving circuit 6 sequentially outputs a horizontal scanning pulse to sequentially select each of the column signal processing circuits 5, and causes each of the selected column signal processing circuits 5 to output a pixel signal to the horizontal signal line 11.

The output circuit 7 outputs the pixel signal sequentially supplied from each of the column signal processing circuits 5 via the horizontal signal line 11 to the outside of the imaging device 1. For example, the output circuit 7 may perform various types of digital signal processing or the like, such as buffering, black level adjustment, and column variation correction for the pixel signal supplied from each of the column signal processing circuits 5, and then output the pixel signal subjected to signal processing to the outside of the imaging device 1.

The imaging device 1 having the above configuration is a so-called column AD type complementary MOS (CMOS) image sensor in which the column signal processing circuit 5 performing CDS processing and AD conversion processing is provided for each column of the pixels 2.

The technology according to the present disclosure is applicable to the imaging device 1 having the above configuration, for example. According to the technology of the present disclosure, the imaging device 1 can suppress entrance of stray light generated inside the imaging device 1 into the photoelectric conversion portion or the charge holding portion by effectively shielding the stray light. According to this configuration, crosstalk between the adjacent pixels 2 and the like can be further suppressed in the imaging device 1 to which the technology according to the present disclosure is applied.

2. First Embodiment (2.1. Pixel Configuration)

Figure 2:
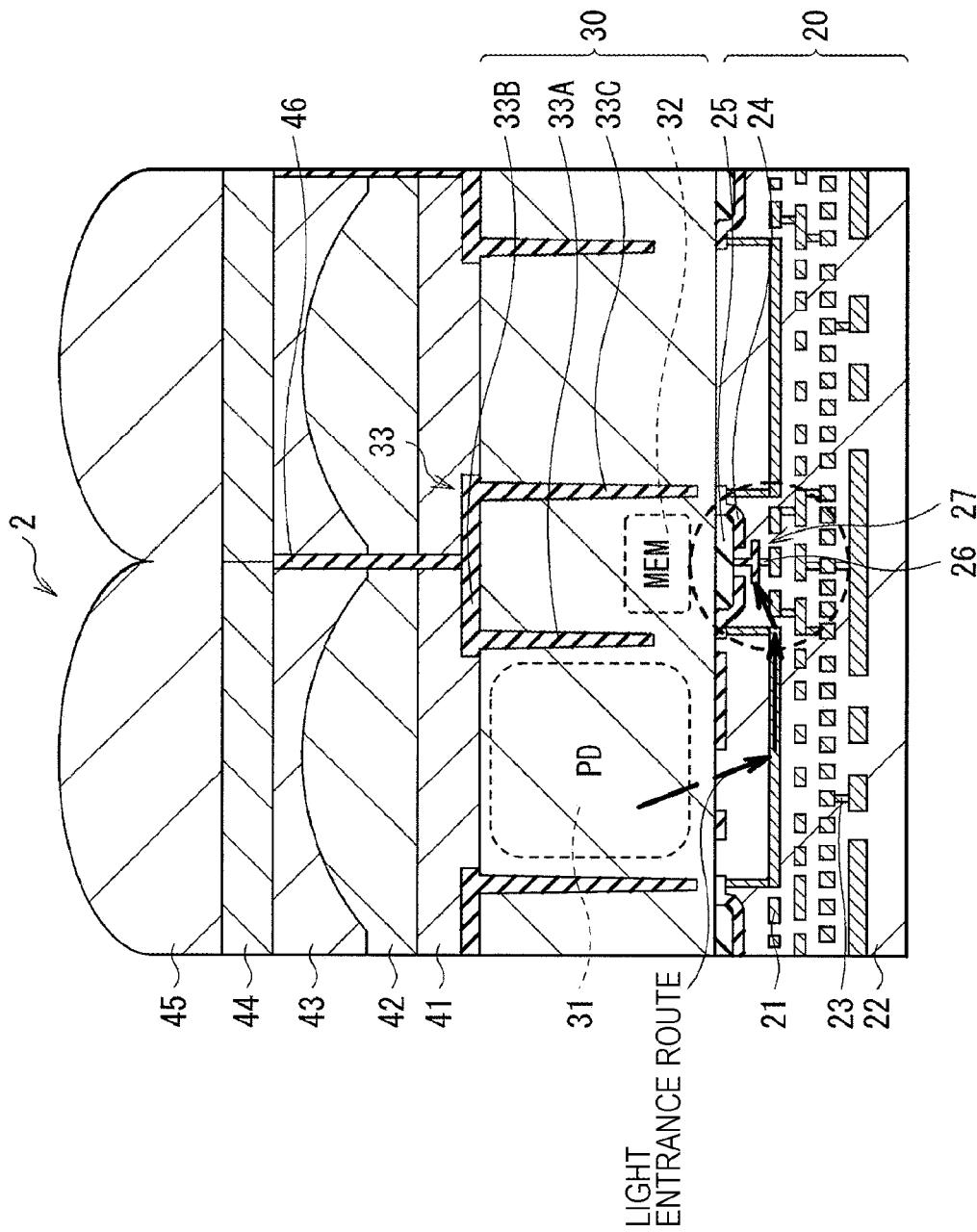
FIG. 2 is a longitudinal cross-sectional view showing a configuration of pixels in an imaging device according to a first embodiment of the present disclosure.

Described next with reference to FIG. 2 will be a configuration of the pixels 2 in the imaging device 1 according to a first embodiment of the present disclosure. FIG. 2 is a longitudinal cross-sectional view showing the configuration of the pixels 2 in the imaging device 1 according to the present embodiment.

As shown in FIG. 2, the imaging device 1 includes a semiconductor substrate 30 and a multilayer wiring layer 20, for example.

The semiconductor substrate 30 is a substrate including a semiconductor such as silicon. For example, the semiconductor substrate 30 includes a photoelectric conversion portion (PD) 31 and a charge holding portion (MEM) 32 for each of the pixels 2. The photoelectric conversion portion 31 and the charge holding portion 32 may include a second conductivity type (for example, n-type) region provided inside a first conductivity type (for example, p-type) region of the semiconductor substrate 30, for example.

The photoelectric conversion portion 31 is a photodiode, for example, and generates charge by photoelectrically converting light having entered the pixel 2. In addition, the charge holding portion 32 is a region where charge generated by the photoelectric conversion portion 31 can be held. The charge holding portion 32 is capable of temporarily holding charge generated by the photoelectric conversion portion 31 for a period from sequential driving of the pixel 2 to readout of a pixel signal. Therefore, the imaging device 1 can achieve a global shutter operation which performs simultaneous exposure for all the pixels by using the charge holding portion 32 provided for each of the pixels 2.

The multilayer wiring layer 20 is provided on one main surface of the semiconductor substrate 30 on the side opposite to the light receiving surface side. For example, the multilayer wiring layer 20 includes a plurality of wiring layers 21, a plurality of interlayer insulating layers 22 for insulating the plurality of wiring layers 21 in the stacking direction, and a plurality of contact plugs 23 so provided as to penetrate the interlayer insulating layers 22 to electrically connect the plurality of wiring layers 21. For example, the multilayer wiring layer 20 includes transistors Tr such as a transfer transistor, an amplification transistor, a selection transistor, and a reset transistor included in a pixel circuit, and wiring for electrically connecting the respective transistors Tr.

Moreover, a gate electrode 25 of the transfer transistor controlling transfer or extraction of charge to or from the charge holding portion 32 is provided in the multilayer wiring layer 20 below a region where the charge holding portion 32 is provided in the semiconductor substrate 30. The gate electrode 25 of the transfer transistor is electrically connected to the wiring layer 21 via the contact plug 26, and is capable of controlling transfer or extraction of charge to or from the charge holding portion 32 by using a voltage applied from the wiring layer 21.

In a case where stray light or the like enters the charge holding portion 32 which temporarily holds charge herein, an amount of charge held in the charge holding portion 32 may increase by generation of new charge in the charge holding portion 32. According to the imaging device 1, therefore, entrance of light into the charge holding portion 32 is suppressed by providing a light-shielding structure 33 in the semiconductor substrate 30, and a wiring light-shielding film 24 in the multilayer wiring layer 20.

For example, the light-shielding structure 33 includes a first light-shielding film 33A, a second light-shielding film 33B, and a third light-shielding film 33C, and is provided so as to cover a region where the charge holding portion 32 is provided by a light-shielding metal such as tungsten (W).

The first light-shielding film 33A is provided between the charge holding portion 32 and the photoelectric conversion portion 31 and extends in the thickness direction of the semiconductor substrate 30. The first light-shielding film 33A is provided to prevent entrance of light, which has not been absorbed by the photoelectric conversion portion 31 but has been transmitted through the semiconductor substrate 30, into the charge holding portion 32.

The second light-shielding film 33B is so provided as to extend in the in-plane direction on the one main surface of the semiconductor substrate 30 in correspondence with the region where the charge holding portion 32 is provided. The second light-shielding film 33B can prevent direct or indirect entrance of light, which has entered from the light-receiving surface side of the semiconductor substrate 30, into the charge holding portion 32.

The third light-shielding film 33C is provided between the photoelectric conversion portion 31 of the adjacent pixel 2 and the charge holding portion 32. The third light-shielding film 33C can prevent entrance of light into the charge holding portion 32 after the light enters the adjacent pixel 2 and passes through the semiconductor substrate 30.

The wiring light-shielding film 24 is provided so as to cover the gate electrode 25 of the transfer transistor from the multilayer wiring layer 20 side. The wiring light-shielding film 24 can prevent entrance of light, which has not been absorbed by the photoelectric conversion portion 31 but transmitted through the semiconductor substrate 30 and reflected on the wiring layer 21, into the charge holding portion 32 from the multilayer wiring layer 20 side.

The wiring light-shielding film 24 further includes an opening 24A for connecting the contact plug 26 to the gate electrode 25 of the transfer transistor. In this case, there is a possibility that light reflected on the wiring layer 21 enters the charge holding portion 32 via the opening 24A through which the contact plug 26 passes.

According to the present embodiment, therefore, a projecting portion 27 which projects in the in-plane direction of the semiconductor substrate 30 and covers the opening 24A is provided on the contact plug 26 electrically connected to the gate electrode 25 of the transfer transistor. Specifically, the projecting portion 27 is provided in a region larger than the region where the opening 24A is formed, and is so provided as to partially overlap the region where the wiring light-shielding film 24 is provided in a plan view of the one main surface of the semiconductor substrate 30. According to this configuration, the charge holding portion 32 can dually shield reflection light coming from the multilayer wiring layer 20 side using both the wiring light-shielding film 24 and the projecting portion 27. According to the present embodiment, therefore, suppression of crosstalk between the adjacent pixels 2, lowering of resolution or color reproduction characteristics, or the like is achievable by suppression of stray light entering the charge holding portion 32.

Note that an interlayer insulating layer 41 which includes an insulating material having high light transmittance is further provided on the one main surface of the semiconductor substrate 30 on the light receiving surface side. The interlayer insulating layer 41 may include an insulating material whose transmittance of light in a visible light band is approximately 70% or more, for example. Alternatively, the interlayer insulating layer 41 may include an insulating material having a smaller refractive index than a refractive index of the semiconductor substrate 30 to suppress reflection of incident light.

For example, the interlayer insulating layer 41 may include an insulating material such as silicon oxide ($SiO_2$), silicon nitride (SiN), silicon oxynitride (SiON), hafnium oxide ($HfO_2$), aluminum oxide ($Al_2O_3$), zirconium oxide ($ZrO_2$), tantalum oxide ($Ta_2O_5$), titanium oxide ($TiO_2$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), thulium oxide ($Tm_2O_3$), ytterbium oxide ($Yb_2O_3$), lutetium oxide ($Lu_2O_3$), and yttrium oxide ($Y_2O_3$).

A sub on-chip lens 42 is further provided on the light receiving surface side of the interlayer insulating layer 41. The sub on-chip lens 42 is provided as a convex lens which concentrates light entering the pixel 2 to achieve efficient entrance of the light into the photoelectric conversion portion 31. For example, the sub on-chip lens 42 may include a transparent organic resin such as a styrene-based resin, an acrylic resin, a styrene-acrylic copolymer-based resin, and a siloxane-based resin to achieve light transmittance of 70% or more in the visible light band. In addition, the sub on-chip lens 42 may be embedded in a planarization film 43 including an organic resin or the like.

A pixel isolation structure 46 formed in the interlayer insulating layer 41, the sub on-chip lens 42, and the planarization film 43 between the pixels 2 is so provided as to penetrate the interlayer insulating layer 41, the sub on-chip lens 42, and the planarization film 43. For example, the pixel isolation structure 46 includes a metal having a light-shielding property, such as tungsten (W). The pixel isolation structure 46 can suppress crosstalk between the adjacent pixels 2 by shielding light obliquely entering between the pixels 2.

A main on-chip lens 45 is further provided on the light receiving surface side of the planarization film 43 with a color filter layer 44 interposed between the main on-chip lens 45 and the planarization film 43. The main on-chip lens 45 can enhance light concentration of incident light entering the photoelectric conversion portion 31 in the pixel 2 in cooperation with the sub on-chip lens 42.

For example, the color filter layer 44 may be formed by applying a resin including red, green, or blue pigments or dyes to the light receiving surface side of the planarization film 43. For example, the color filter layer 44 may be provided so that respective colors of red, green, and blue have Bayer arrangement, or may be provided so that respective colors of red, green, and blue have another arrangement.

Similarly to the sub on-chip lens 42, the main on-chip lens 45 is provided as a convex lens which concentrates incident light entering the pixel 2 to achieve efficient entrance of the light into the photoelectric conversion portion 31. For example, the main on-chip lens 45 may include a transparent organic resin such as a styrene-based resin, an acrylic resin, a styrene-acrylic copolymer-based resin, and a siloxane-based resin to achieve light transmittance of 70% or more in a visible light band.

According to the imaging device 1 of the present embodiment, the projecting portion 27 which projects in the in-plane direction of the semiconductor substrate 30 is provided on the contact plug 26 electrically connected to the gate electrode 25 of the transfer transistor which controls entrance and exit of charge held by the charge holding portion 32. According to this configuration, the opening 24A provided in the wiring light-shielding film 24 for allowing passage of the contact plug 26 can be covered by the projecting portion 27. Therefore, stray light entering the charge holding portion 32 can be further suppressed.

(2.2. Configuration Example of Projecting Portion)

Described next with reference to FIG. 3 and FIGS. 4A to 4D will be a specific configuration example of the projecting portion 27 provided on the contact plug 26.

(First Configuration Example)

A first configuration example of the projecting portion 27 will be initially described with reference to FIG. 3. FIG. 3 is a longitudinal cross-sectional view showing the first configuration example of the projecting portion 27. In FIG. 3, the downward direction as viewed from the side opposed to the figure corresponds to the direction toward the semiconductor substrate 30 side (i.e., the light receiving surface side), while the upward direction as viewed from the side opposed to the figure corresponds to the direction toward the multilayer wiring layer 20 side.

As shown in FIG. 3, the transfer transistor controlling entrance and exit of charge held by the charge holding portion 32 may be provided as an embedded-type field transistor which includes a gate electrode 250 embedded in the semiconductor substrate 30, for example.

The gate electrode 250 includes polysilicon or the like, for example, and includes a flat portion 250A provided on the one main surface of the semiconductor substrate 30, and a dug portion 250B dug into the semiconductor substrate 30. A gate insulating film 251 including silicon oxide or the like and provided on an interface between the gate electrode 250 and the semiconductor substrate 30 is provided so as to cover the gate electrode 250. Moreover, a conductive impurity is introduced into a predetermined region of the semiconductor substrate 30 to form a channel in the semiconductor substrate 30 as a charge transfer path from the charge holding portion 32.

A side wall insulating film 252 is provided on the side surface of the flat portion 250A of the gate electrode 250. The side wall insulating film 252 includes an insulating material such as silicon oxide, silicon nitride, or silicon oxynitride, and is provided to highly accurately control the region of the semiconductor substrate 30 where the conductive impurity is introduced. For example, the side wall insulating film 252 is produced by forming an insulating layer which includes an insulating material in such a manner as to cover the upper surface of the flat portion 250A of the gate electrode 250, and then vertically and anisotropically etching the insulating layer.

A first insulating layer 223 and a second insulating layer 224 are sequentially provided on the upper surface of the flat portion 250A of the gate electrode 250. Specifically, the first insulating layer 223 and the second insulating layer 224 are uniformly provided on the semiconductor substrate 30, and so formed as to cover the flat portion 250A of the gate electrode 250 and the side wall insulating film 252. The first insulating layer 223 and the second insulating layer 224 may include an insulating material such as silicon oxide, silicon nitride, or silicon oxynitride.

A wiring light-shielding film 240 is provided on the second insulating layer 224. Specifically, the wiring light-shielding film 240 includes a light-shielding metal material such as tungsten, and is provided on the second insulating layer 224. In addition, an opening 240A for allowing passage of a contact plug electrically connected to the gate electrode 250 is provided in the wiring light-shielding film 240 above the flat portion 250A of the gate electrode 250. Note that a barrier layer 241 may be provided on the upper surface of the wiring light-shielding film 240 to suppress diffusion of a metal material forming the wiring light-shielding film 240. For example, the barrier layer 241 may include titanium, tantalum, titanium nitride, tantalum nitride, or the like.

A third insulating layer 221 is provided on the wiring light-shielding film 240. The third insulating layer 221 is uniformly provided on the one main surface of the semiconductor substrate 30, and so formed as to cover the upper surface of the wiring light-shielding film 240 and the inside of the opening 240A of the wiring light-shielding film 240 along the shape of the wiring light-shielding film 240. The third insulating layer 221 may include an insulating material such as silicon oxide, silicon nitride, or silicon oxynitride.

The first contact plug 270 is so provided as to pass through an opening formed in the wiring light-shielding film 240 and penetrate the first insulating layer 223, the second insulating layer 224, and the third insulating layer 221 to be electrically connected to the gate electrode 250. Specifically, the first contact plug 270 includes an extending portion 270B extending from the upper surface of the flat portion 250A of the gate electrode 250 to the upper side of the third insulating layer 221 in the thickness direction of the semiconductor substrate 30, and a projecting portion 270A projecting in the in-plane direction of the semiconductor substrate 30 along the shape of the third insulating layer 221.

The projecting portion 270A is so provided as to cover the opening 240A formed in the wiring light-shielding film 240, and overlap the region where the wiring light-shielding film 240 is provided in the in-plane direction of the semiconductor substrate 30. For example, the projecting portion 270A may be provided so as to cover an area slightly larger than the opening 240A formed in the wiring light-shielding film 240 in a plan view of the one main surface of the semiconductor substrate 30 as viewed in the thickness direction of the semiconductor substrate 30. The projecting portion 270A may be provided either symmetrically or asymmetrically within the plane of the semiconductor substrate 30. The first contact plug 270 including the projecting portion 270A may include a light-shielding metal material such as tungsten.

Moreover, a fourth insulating layer 222 is so provided as to extend over the entire surface of the semiconductor substrate 30 such that the first contact plug 270 is embedded in the fourth insulating layer 222. The fourth insulating layer 222 may include an insulating material such as silicon oxide, silicon nitride, or silicon oxynitride.

A second contact plug 260 is provided on the projecting portion 270A of the first contact plug 270 and penetrates the fourth insulating layer 222. The second contact plug 260 may be provided on the projecting portion 270A coaxially with the extending portion 270B of the first contact plug 270, for example. The second contact plug 260 electrically connects the first contact plug 270 and the wiring layer 21. In this manner, a potential is applied to the gate electrode 250 from the wiring layer 21 via the first contact plug 270 and the second contact plug 260. Note that a barrier layer 261 may be provided on the surface of the second contact plug 260 to suppress diffusion of a metal material forming the second contact plug 260. For example, the barrier layer 261 may include titanium, tantalum, titanium nitride, tantalum nitride, or the like.

Described next with reference to FIGS. 4A to 4D will be a forming method of the projecting portion 270A according to the first configuration example shown in FIG. 3. FIGS. 4A to 4D are longitudinal cross-sectional views explaining respective steps of the forming method of the projecting portion 270A according to the first configuration example.

Initially, by using a known method, the gate insulating film 251 and the gate electrode 250 are formed, and then the side wall insulating film 252, the first insulating layer 223, and the second insulating layer 224 are formed on the semiconductor substrate 30 as shown in FIG. 4A. Subsequently, the wiring light-shielding film 240 is formed on the second insulating layer 224, and then the opening 240A is formed in a region including the region where the first contact plug 270 is to be formed in a later step. Moreover, the third insulating layer 221 is uniformly formed on the wiring light-shielding film 240 and the second insulating layer 224.

Subsequently, as shown in FIG. 4B, a contact opening 271 penetrating the third insulating layer 221, the second insulating layer 224, and the first insulating layer 223 to allow exposure of the gate electrode 250 is formed inside the opening 240A of the wiring light-shielding film 240 using dry etching.

Thereafter, as shown in FIG. 4C, a light-shielding material such as tungsten is formed on the third insulating layer 221 to fill the contact opening 271 with the light-shielding material. Subsequently, a part of the light-shielding material is removed by etching to form the first contact plug 270. For example, the light-shielding material is removed from the upper side of the third insulating layer 221 such that a part of the region where the projecting portion 270A of the first contact plug 270 is formed and a part of the region where the wiring light-shielding film 240 is formed overlap with each other in the thickness direction of the semiconductor substrate 30. In this manner, the first contact plug 270 which includes the light-shielding material formed inside the contact opening 271 as the extending portion 270B, and the light-shielding material formed on the third insulating layer 221 as the projecting portion 270A is produced.

Thereafter, as shown in FIG. 4D, the first contact plug 270, and the fourth insulating layer 222 on the third insulating layer 221 are uniformly formed using chemical vapor deposition (CVD) or the like, and then the fourth insulating layer 222 is planarized by chemical mechanical polishing (CMP). Thereafter, an opening penetrating the fourth insulating layer 222 to allow exposure of the first contact plug 270 is formed by etching or the like, and then the opening is filled with tungsten or the like to form the second contact plug 260. Subsequently, the wiring layer 21 electrically connected to the second contact plug 260 is formed.

The projecting portion 270A according to the first configuration example can be produced by the steps described above. According to the projecting portion 270A of the first configuration example, the projecting portion 270A of the first contact plug 270 is provided on the side opposite to the side where the semiconductor substrate 30 is provided with respect to the wiring light-shielding film 240 (i.e., upper side in FIG. 3). According to the first configuration example, the opening 240A formed above the gate electrode 250 of the wiring light-shielding film 240 is shielded without a clearance by the projecting portion 270A of the first contact plug 270 in a plan view as viewed in the thickness direction of the semiconductor substrate 30. Accordingly, the projecting portion 270A can shield, in the thickness direction of the semiconductor substrate 30, the opening 240A formed in the wiring light-shielding film 240 to provide the first contact plug 270 electrically connected to the gate electrode 250. Therefore, the projecting portion 270A can suppress stray light traveling from the multilayer wiring layer 20 to the semiconductor substrate 30.

(Second Configuration Example)

A second configuration example of the projecting portion 27 will be next described with reference to FIG. 5. FIG. 5 is a longitudinal cross-sectional view showing the second configuration example of the projecting portion 27. In FIG. 5, the downward direction as viewed from the side opposed to the figure corresponds to the direction toward the semiconductor substrate 30 side (i.e., the light receiving surface side), while the upward direction as viewed from the side opposed to the figure corresponds to the direction toward the multilayer wiring layer 20 side.

As shown in FIG. 5, the second configuration example is different from the first configuration example in that the projecting portion 270A of the first contact plug 270 is provided on the side where the semiconductor substrate 30 is provided (i.e., lower side in FIG. 5) with respect to the wiring light-shielding film 240. Note that the gate electrode 250, the gate insulating film 251, the side wall insulating film 252, the first insulating layer 223, the second insulating layer 224, and the fourth insulating layer 222 are configured as described with reference to FIG. 3. Accordingly, the same description is omitted herein.

The first contact plug 270 is provided on the second insulating layer 224 corresponding to the flat portion 250A of the gate electrode 250, and is electrically connected to the gate electrode 250. The first contact plug 270 includes the extending portion 270B so provided as to penetrate the first insulating layer 223 and the second insulating layer 224, and the projecting portion 270A provided on the second insulating layer 224 and so formed as to project in the in-plane direction of the semiconductor substrate 30.

The projecting portion 270A is provided in a region larger than the opening 240A provided in the wiring light-shielding film 240 to allow passage of the second contact plug 260 through the opening 240A. For example, the projecting portion 270A may be provided in a flat region corresponding to the upper surface of the flat portion 250A of the gate electrode 250. The projecting portion 270A may be provided either symmetrically or asymmetrically within the plane of the semiconductor substrate 30. The first contact plug 270 including the projecting portion 270A may include a light-shielding metal material such as tungsten.

Moreover, the third insulating layer 221 is provided on the second insulating layer 224 and the projecting portion 270A of the first contact plug 270. The third insulating layer 221 is uniformly provided on the one main surface of the semiconductor substrate 30, and so formed as to cover the gate electrode 250 including the projecting portion 270A of the first contact plug 270. The third insulating layer 221 may include an insulating material such as silicon oxide, silicon nitride, or silicon oxynitride.

The wiring light-shielding film 240 is provided on the third insulating layer 221. Specifically, the wiring light-shielding film 240 including a light-shielding metal material such as tungsten is provided on the third insulating layer 221. In addition, an opening 240A for allowing passage of a contact plug electrically connected to the gate electrode 250 is provided in the wiring light-shielding film 240 above the flat portion 250A of the gate electrode 250. The opening 240A provided in the wiring light-shielding film 240 may be formed in a region slightly smaller than the region where the projecting portion 270A of the first contact plug 270 is provided. Note that a barrier layer 241 may be provided on the upper surface of the wiring light-shielding film 240 to suppress diffusion of a metal material forming the wiring light-shielding film 240. For example, the barrier layer 241 may include titanium, tantalum, titanium nitride, tantalum nitride, or the like.

The second contact plug 260 passing through the opening 240A of the wiring light-shielding film 240, and penetrating the third insulating layer 221 and the fourth insulating layer 222 is provided on the projecting portion 270A of the first contact plug 270. The second contact plug 260 may be provided on the projecting portion 270A coaxially with the extending portion 270B of the first contact plug 270, for example. The second contact plug 260 electrically connects the first contact plug 270 and the wiring layer 21. In this manner, a potential is applied to the gate electrode 250 from the wiring layer 21 via the first contact plug 270 and the second contact plug 260. Note that a barrier layer 261 may be provided on the surface of the second contact plug 260 to suppress diffusion of a metal material forming the second contact plug 260. For example, the barrier layer 261 may include titanium, tantalum, titanium nitride, tantalum nitride, or the like.

A forming method of the projecting portion 270A according to the second configuration example shown in FIG. 5 will be next described with reference to FIGS. 6A to 6E. FIGS. 6A to 6E are longitudinal cross-sectional views explaining respective steps of the forming method of the projecting portion 270A according to the second configuration example.

Initially, by using a known method, the gate insulating film 251 and the gate electrode 250 are formed, and then the side wall insulating film 252, the first insulating layer 223, and the second insulating layer 224 are formed on the semiconductor substrate 30 as shown in FIG. 6A.

Subsequently, as shown in FIG. 6B, the contact opening 271 penetrating the second insulating layer 224 and the first insulating layer 223 to allow exposure of the gate electrode 250 is formed by dry etching.

Thereafter, as shown in FIG. 6C, a light-shielding material such as tungsten is formed on the second insulating layer 224 to fill the contact opening 271 with the light-shielding material. Subsequently, the light-shielding material in an area other than the upper surface of the gate electrode 250 is removed by etching to form the first contact plug 270. In this manner, the first contact plug 270 which includes the light-shielding material formed inside the contact opening 271 as the extending portion 270B, and the light-shielding material formed on the second insulating layer 224 as the projecting portion 270A is produced.

Thereafter, as shown in FIG. 6D, the third insulating layer 221 is uniformly formed on the first contact plug 270 and the second insulating layer 224. Subsequently, the wiring light-shielding film 240 is formed on the third insulating layer 221, and then the opening 240A is formed in a region including the region where the second contact plug 260 connected to the gate electrode 250 is to be formed.

Thereafter, as shown in FIG. 6E, the wiring light-shielding film 240, and the fourth insulating layer 222 on the third insulating layer 221 are uniformly formed using chemical vapor deposition (CVD) or the like, and then the fourth insulating layer 222 is planarized by chemical mechanical polishing (CMP). Thereafter, an opening penetrating the third insulating layer 221 and the fourth insulating layer 222 to allow exposure of the first contact plug 270 is formed by etching or the like, and then the opening is filled with tungsten or the like to form the second contact plug 260. Subsequently, the wiring layer 21 electrically connected to the second contact plug 260 is formed.

The projecting portion 270A according to the second configuration example can be formed by the steps described above. According to the projecting portion 270A of the second configuration example, the projecting portion 270A of the first contact plug 270 is provided on the side where the semiconductor substrate 30 is provided with respect to the wiring light-shielding film 240 (i.e., lower side in FIG. 5). According to the second configuration example, similarly to the first configuration example, the opening 240A formed on the gate electrode 250 of the wiring light-shielding film 240 is shielded without a clearance by the projecting portion 270A of the first contact plug 270 in a plan view as viewed in the thickness direction of the semiconductor substrate 30. Therefore, the projecting portion 270A can suppress stray light traveling from the multilayer wiring layer 20 to the semiconductor substrate 30.

2.3. Modifications

Next described with reference to FIGS. 7 to 10 will be modifications of the imaging device 1 according to the present embodiment. The technology according to the present embodiment is applicable to a device other than the imaging device 1 which includes the charge holding portion 32 as shown in FIG. 2 to achieve a global shutter operation. Each of FIGS. 7 to 10 is a longitudinal cross-sectional view showing an example of an imaging device to which the technology according to the present embodiment is applicable.

For example, as shown in FIG. 7, the technology according to the present embodiment is also applicable to an imaging device which achieves a global shutter operation using a floating diffusion region (FD) 34 having a predetermined capacity instead of the charge holding portion 32.

According to the imaging device shown in FIG. 7, the floating diffusion region 34 is provided instead of the charge holding portion 32. Therefore, the light-shielding structure 33 and the wiring light-shielding film 24 are not provided. In addition, the pixel isolation structure 46 includes a pixel insulating film 46A and a pixel defining film 46B. The pixel insulating film 46A includes an insulating material and so provided as to extend in the thickness direction of the semiconductor substrate 30 to electrically isolate the pixels 2 from each other. The pixel defining film 46B includes light-shielding tungsten or the like, and defines a range of the pixel 2.

According to the imaging device configured as above, the projecting portion 27 is provided on the contact plug 26 connected to the gate electrode 25 of a field effect transistor which controls entrance and exit of charge to and from the floating diffusion region 34. According to this configuration, the projecting portion 27 can shield the floating diffusion region 34 from light passing through the semiconductor substrate 30 and reflected on the wiring layer 21 in the adjacent pixels 2. Therefore, the projecting portion 27 can suppress crosstalk between the adjacent pixels 2 even in the imaging device configured as above.

Moreover, as shown in FIG. 8, the technology according to the present embodiment is also applicable to an imaging device which includes the charge holding portion 32 stacked on the photoelectric conversion portion 31 in the thickness direction of the semiconductor substrate 30.

According to the imaging device shown in FIG. 8, the light-shielding structure 33 is provided between the charge holding portion 32 and the photoelectric conversion portion, and on the side of the charge holding portion 32. In addition, the pixel isolation structure 46 includes a pixel insulating film 46A and a pixel defining film 46B. The pixel insulating film 46A includes an insulating material and so provided as to extend in the thickness direction of the semiconductor substrate 30 to electrically isolate the pixels 2 from each other. Moreover, the pixel defining film 46B including tungsten or the like having a light-shielding property defines the range of the pixel 2, and prevents entrance of reflection light or the like into the adjacent pixel 2 in a region where the sub on-chip lens 42 is provided.

According to the imaging device configured as above, the projecting portion 27 is provided on the contact plug 26 electrically connected to the gate electrode 25 of a field effect transistor which controls entrance and exit of charge to and from the charge holding portion 32. According to this configuration, the projecting portion 27 can shield the charge holding portion 32 from light passing through the semiconductor substrate 30 and reflected on the wiring layer 21 in the adjacent pixels 2. Therefore, the projecting portion 27 can suppress crosstalk between the adjacent pixels 2 even in the imaging device configured as above.

Furthermore, as shown in FIG. 9, the technology according to the present embodiment is also applicable to an imaging device used as an in-vehicle device and including a mixture of pixels of different sizes. The imaging device which includes a mixture of pixels of different sizes can perform such an operation which uses a pixel signal of a small pixel in a bright environment, and uses a pixel signal of a large pixel in a dark environment. Therefore, the imaging device which includes a mixture of pixels of different sizes can expand a detectable dynamic range of a light amount.

According to the imaging device shown in FIG. 9, the charge holding portion 32 is not provided. Therefore, the light-shielding structure 33 and the wiring light-shielding film 24 are not provided. In addition, the pixel isolation structure 46 includes a pixel insulating film 46A and a pixel defining film 46B. The pixel insulating film 46A includes an insulating material and so provided as to extend in the thickness direction of the semiconductor substrate 30 to electrically isolate the pixels 2 from each other. The pixel defining film 46B includes light-shielding tungsten or the like, and defines a range of the pixel 2.

According to the imaging device configured as above, the projecting portion 27 is provided on the contact plug 26 electrically connected to the gate electrode 25 of a field effect transistor provided between the pixels 2. According to the imaging device which includes a mixture of pixels of different sizes, the presence or absence of the field effect transistor between the pixels 2 switches in accordance with the arrangement of the pixels 2. In this case, there is a possibility that the light-shielding property between the pixels 2 lowers by the presence of the field effect transistor between the pixels 2.

According to the technology of the present embodiment, the projecting portion 27 is provided to shield light passing through the semiconductor substrate 30 and reflected on the wiring layer 21 in the adjacent pixels 2. In this case, lowering of the light shielding property between the pixels 2 where the field effect transistor is present can be reduced. Therefore, the projecting portion 27 can suppress crosstalk between the adjacent pixels 2 even in the imaging device configured as above.

Furthermore, as shown in FIG. 10, the technology according to the present embodiment is also applicable to a backside illumination type imaging device.

According to the imaging device shown in FIG. 10, the charge holding portion 32 is not provided. Therefore, the light-shielding structure 33 and the wiring light-shielding film 24 are not provided. In addition, the pixel isolation structure 46 includes a pixel insulating film 46A and a pixel defining film 46B. The pixel insulating film 46A includes an insulating material and so provided as to extend in the thickness direction of the semiconductor substrate 30 to electrically isolate the pixels 2 from each other. Moreover, the pixel defining film 46B including tungsten or the like having a light-shielding property defines the range of the pixel 2, and prevents entrance of reflection light or the like into the adjacent pixel 2 in a region where the sub on-chip lens 42 is provided.

According to the imaging device configured as above, the projecting portion 27 is provided on the contact plug 26 electrically connected to the gate electrode 25 of a field effect transistor provided between the pixels 2. According to the backside illumination type imaging device, the multilayer wiring layer 20 is provided on the side opposite to the light receiving surface side with respect to the photoelectric conversion portion 31. The layout of the wiring layer 21 provided in the multilayer wiring layer 20 varies in accordance with the arrangement direction of the pixels 2, for example. In this case, the amount of light reflected on the wiring layer 21 of the multilayer wiring layer 20 varies in accordance with the arrangement direction of the pixels 2 and the like. Therefore, a resolution difference, or a luminance difference may be produced for each of the pixels 2 in accordance with the layout of the wiring layer 21.

According to the technology of the present embodiment, the projecting portion 27 is provided to shield light passing through the semiconductor substrate 30 and reflected on the wiring layer 21 in the adjacent pixel 2. In this case, crosstalk between the adjacent pixels 2 caused by stray light can be reduced. Therefore, the projecting portion 27 can suppress a resolution difference or a luminance difference for each of the pixels 2 produced by the layout of the wiring layer 21.

3. Second Embodiment (3.1. Pixel Configuration)

Described next with reference to FIG. 11 will be a configuration of the pixels 2 in an imaging device according to a second embodiment of the present disclosure. FIG. 11 is a plan view showing an example of the pixel 2 of the imaging device according to the present embodiment.

As shown in FIG. 11, the pixel 2 includes, as a photoelectric conversion portion 70, a photodiode which includes a second conductivity type (for example, n-type) region inside a first conductivity type (for example, p-type) region formed in a semiconductor substrate 51. The photoelectric conversion portion 70 can generate and accumulate an amount of charge corresponding to incident light by photoelectric conversion.

In addition, the pixel 2 includes a first transfer gate (gate electrode 61), a charge holding portion 71, a second transfer gate (gate electrode 62), a floating diffusion region 72, a reset transistor (gate electrode 63), an amplification transistor (gate electrode 64), and a selection transistor (gate electrode 65).

The gate electrode 61 of the first transfer gate is provided between the photoelectric conversion portion 70 and the charge holding portion 71 and on an upper part of the charge holding portion 71 with a gate insulating film interposed between the gate electrode 61 and the photoelectric conversion portion 70 and the charge holding portion 71. In the first transfer gate, a transfer pulse is applied to the gate electrode 61 via a contact to transfer charge accumulated in the photoelectric conversion portion 70 to the charge holding portion 71.

The charge holding portion 71 is disposed below the gate electrode 61 of the first transfer gate and produced by forming a second conductivity type (for example, n-type) region inside a first conductivity type (for example, p-type) region of the semiconductor substrate 51. The charge holding portion 71 temporarily holds charge transferred from the photoelectric conversion portion 70 by the first transfer gate.

The gate electrode 62 of the second transfer gate is provided between the charge holding portion 71 and the floating diffusion region 72 with a gate insulating film interposed between the gate electrode 62 and the charge holding portion 71 and the floating diffusion region 72. In the second transfer gate, a transfer pulse is applied to the gate electrode 62 via a contact to transfer charge held in the charge holding portion 71 to the floating diffusion region 72.

The floating diffusion region 72 is a second conductivity type (for example, n-type) region of the semiconductor substrate 51, and accumulates charge to convert the accumulated charge into voltage. A contact 73 is electrically connected to the floating diffusion region 72 via a contact wiring layer 83.

The gate electrode 63 of the reset transistor is provided adjacent to the floating diffusion region 72. In the reset transistor, the source is electrically connected to the floating diffusion region 72, and the drain is electrically connected to the power supply via a contact 74 disposed with a contact wiring layer 84 interposed between the drain and the contact 74. In the reset transistor, a reset pulse is applied to the gate electrode 63 via the contact to discharge charge from the floating diffusion region 72 to the power supply and reset the floating diffusion region 72.

The gate electrode 64 of the amplification transistor is provided on the side opposite to the gate electrode 63 of the reset transistor with respect to the contact wiring layer 84. In the amplification transistor, the source is electrically connected to the drain of the selection transistor, and the drain is electrically connected to the power supply via the contact 74 disposed with the contact wiring layer 84 interposed between the drain and the contact 74. In the amplification transistor, the floating diffusion region 72 is electrically connected to the gate electrode 64 via a contact.

The gate electrode 65 of the selection transistor is provided adjacent to the gate electrode 64 of the amplification transistor. In the selection transistor, the source is electrically connected to the vertical signal line via a contact 75 disposed with the contact wiring layer 85 interposed between the source and the contact 75, and the drain is electrically connected to the source of the amplification transistor. In the selection transistor, a selection pulse is applied to the gate electrode 64 via the contact to select the pixel 2 as a target from which a pixel signal is read. In response to turning on of the selection transistor, the amplification transistor outputs a pixel signal corresponding to charge accumulated in the floating diffusion region 72 to the vertical signal line via the selection transistor, the contact wiring layer 85, and the contact 75.

The pixel 2 further includes a charge discharging gate (gate electrode 66) and a charge discharging portion 76.

The gate electrode 66 of the charge discharging gate is provided between the photoelectric conversion portion 70 and the charge discharging portion 76 with a gate insulating film interposed between the gate electrode 66 and the photoelectric conversion portion 70 and the charge discharging portion 76. In the charge discharging gate, a control pulse is applied to the gate electrode 66 via the contact to transfer charge accumulated in the photoelectric conversion portion 70 to the charge discharging portion 76.

The charge discharging portion 76 is provided in the second conductivity type (for example, n-type) region of the semiconductor substrate 51, and is electrically connected to the power supply via a contact wiring layer 86 and a contact 77. The charge discharging gate and the charge discharging portion 76 is capable of preventing saturation of the photoelectric conversion portion 70 during a pixel signal readout period after completion of exposure of the pixel 2 and overflow of charge caused by the saturation.

While not shown in FIG. 11, a light-shielding film including tungsten or the like is provided on the upper surface of the pixel 2 with an insulating layer interposed between the light-shielding film and the pixel 2. For example, the light-shielding film has an opening in each of a region corresponding to a light-receiving portion of the photoelectric conversion portion 70, and regions where the respective contacts are formed. The light-shielding film is capable of suppressing noise generated in a pixel signal as a result of entrance of light into the charge holding portion 71, the floating diffusion region 72, and the like other than the photoelectric conversion portion 70.

However, there is a possibility that stray light enters a charge accumulation region of the semiconductor substrate 51 through the openings formed in the light-shielding film to allow passage of the respective contacts. The charge accumulation region is a region provided in the pixel 2 and including the photoelectric conversion portion 70, the charge holding portion 71, and the floating diffusion region 72 capable of accumulating charge. In the charge accumulation region, there is a possibility that new charge is generated by photoelectric conversion caused inside the semiconductor substrate 51 as a result of entrance of light. Therefore, it is important to suppress reflection light entering the semiconductor substrate 51 in the charge accumulation region.

According to the imaging device of the present embodiment, the contacts are provided in a region other than the charge accumulation region to form the openings in a region other than the charge accumulation region in the light-shielding film, and thereby further suppress entrance of light into the semiconductor substrate 51 in the charge accumulation region. Specifically, the contact 73 electrically connected to the floating diffusion region 72 is provided in a non-charge accumulation region such as an element isolation layer, and is electrically connected to the floating diffusion region 72 via the contact wiring layer 83 wired in the in-plane direction of the semiconductor substrate 51. According to this configuration, the opening formed in the shielding film to provide the contact 73 is located not above the floating diffusion region 72 but above the element isolation layer. Therefore, the imaging device according to the present embodiment can suppress direct entrance of light into the floating diffusion region 72.

The non-charge accumulation region herein is a region other than the charge accumulation region in the region of the pixel 2. Specifically, the non-charge accumulation region refers to each of a region included in the pixel 2 and corresponding to a region where the element isolation layer including an insulating material is provided, a region where an electrode or wiring is provided, and a region where a readout circuit provided in a stage following conversion of charge into voltage in the floating diffusion region 72 (i.e., a circuit including an amplification transistor, a selection transistor, and a reset transistor) is provided. In these non-charge accumulation regions, noise is less likely to be generated in a pixel signal by entrance of light. Therefore, an influence of entrance of light is reduced even in a case where an opening is provided in the light-shielding film.

Moreover, similarly to the contact 73, the contacts 74, 75, and 77 electrically connected to the semiconductor substrate 51 may be provided in the non-charge accumulation region such as the element isolation layer, and electrically connected to the semiconductor substrate 51 via the contact wiring layers 84, 85, and 86. This configuration suppresses direct entrance of light into the semiconductor substrate 51 via the openings formed in the light-shielding film to allow passage of the contacts 74, 75, and 77. Therefore, entrance of light into the photoelectric conversion portion 70, the charge holding portion 71, or the floating diffusion region 72 can be further suppressed after the light enters the semiconductor substrate 51 and propagates through the semiconductor substrate 51.

(3.2. Configuration Example of Contact Wiring Layer)

Described next with reference to FIGS. 12 and 13 will be a specific configuration example of the contact 73 and the contact wiring layer 83 while showing cross sections taken along a cutting line C-CC in FIG. 11. FIG. 12 is a longitudinal cross-sectional view showing a sectional structure taken along the cutting line C-CC in FIG. 11. FIG. 13 is a longitudinal cross-sectional view showing a modification of the sectional structure shown in FIG. 12.

As shown in FIG. 12, the semiconductor substrate 51 includes the floating diffusion region 72 of the second conductivity type (for example, n-type). A first insulating layer 521 including an insulating material such as silicon oxide, silicon nitride, or silicon oxynitride is provided on the semiconductor substrate 51. The contact wiring layer 83 electrically connected to the floating diffusion region 72 via a plug 580 is provided on the first insulating layer 521.

Note that the first insulating layer 521 functions as a gate insulating film of an adjacent reset transistor. Therefore, the gate electrode 63 of the reset transistor is provided on the first insulating layer 521 on the CC end side.

For example, the contact wiring layer 83 extends to the upper side of the element isolation layer 513 formed by embedding silicon oxide or the like in the semiconductor substrate 51, and is electrically connected to the contact 73 on the element isolation layer 513. Each of the contact wiring layer 83 and the plug 580 includes a conductive material. For example, the contact wiring layer 83 and the plug 580 may include polysilicon doped with a conductive impurity at a high concentration, or may include a metal such as tungsten.

A light-shielding film 530 is formed on the contact wiring layer 83 and the gate electrode 63 with a second insulating layer 522 interposed between the light-shielding film 530 and the contact wiring layer 83 and the gate electrode 63. The second insulating layer 522 includes an insulating material such as silicon oxide, silicon nitride, or silicon oxynitride. The light-shielding film 530 includes tungsten or the like having a light-shielding property, and is provided in a region other than a light-receiving portion of the photoelectric conversion portion 70 of the pixel 2 along recesses and protrusions of respective components provided on the semiconductor substrate 51.

The light-shielding film 530 includes an opening 530A through which the contact 73 passes. Specifically, the light-shielding film 530 includes the opening 530A above the element isolation layer 513. The contact 73 passes through the opening 530A to be electrically connected to the floating diffusion region 72 and the contact wiring layer 83. According to this configuration, light passing through the opening 530A of the light-shielding film 530 does not directly enter the floating diffusion region 72, but enters the contact wiring layer 83 and the element isolation layer 513. Therefore, according to the technology of the present embodiment, generation of charge and noise caused by stray light entering the floating diffusion region 72 can be suppressed.

Note that a third insulating layer 523 including an insulating material such as silicon oxide, silicon nitride, or silicon oxynitride is provided on the light-shielding film 530.

Moreover, as shown in FIG. 13, a silicide region 583 may be provided in the contact wiring layer 83 in a region in contact with the contact 73.

The silicide region 583 is a region where a metal-silicon compound (so-called silicide compound) such as CoSi is provided. The silicide compound has a higher absorptance of light in a visible light band than that absorptance of polysilicon or the like. The silicide region 583 thus provided therefore can reduce transmittance of light passing through the opening 530A of the light-shielding film 530 toward the semiconductor substrate 51 side. Accordingly, the silicide region 583 can further suppress stray light entering the floating diffusion region 72, and charge and noise generated by the stray light.

(3.3. Forming Method of Contact Wiring Layer)

(First Forming Method)

Described next with reference to FIGS. 14A to 14H will be a first forming method of the contact wiring layer 83 shown in FIG. 12. FIGS. 14A to 14H are longitudinal cross-sectional views explaining respective steps of the first forming method of the contact wiring layer 83. The first forming method is a method which simultaneously forms the contact wiring layer 83 and the gate electrode 63.

Initially, as shown in FIG. 14A, the first insulating layer 521 is formed on the semiconductor substrate 51 where the element isolation layer 513 and the floating diffusion region 72 are provided. Thereafter, an opening 591 for producing the plug 580 is formed in the first insulating layer 521 by etching using a patterned resist 590.

Subsequently, as shown in FIG. 14B, the resist 590 is removed, and then a silicon layer 585 is formed on the first insulating layer 521. As a result, the opening 591 formed in the first insulating layer 521 is filled with silicon, and the plug 580 is thus produced.

Thereafter, as shown in FIG. 14C, a part of the silicon layer 585 is removed by etching using a patterned resist 592 to form a silicon layer 585A which becomes the contact wiring layer 83 in a later step, and a silicon layer 585B which becomes the gate electrode 63 in a later step.

Subsequently, as shown in FIG. 14D, implantation of a conductive impurity is performed using, as a mask, a resist 594 which has openings in regions corresponding to the silicon layers 585A and 585B. In this manner, the conductivity type impurity is introduced into the silicon layers 585A and 585B to make the silicon layers 585A and 585B conductive. As a result, the silicon layer 585B becomes the gate electrode 63.

Moreover, as shown in FIG. 14E, implantation of conductive impurities is performed using, as a mask, a resist 595 which has an opening in a region corresponding to a region where the silicon layer 585A is formed. In this manner, the conductivity type impurity is introduced into the silicon layer 585A at a higher concentration. As a result, the silicon layer 585A becomes the contact wiring layer 83.

Subsequently, as shown in FIG. 14F, a second insulating layer 522 and a light-shielding film 530 are sequentially formed on the contact wiring layer 83 and the gate electrode 63.

Thereafter, as shown in FIG. 14G, a third insulating layer 523 is formed on the light-shielding film 530. Then, the third insulating layer 523, the light-shielding film 530, and the second insulating layer 522 are etched by using a patterned resist 596 to form an opening 597 which penetrates the third insulating layer 523, the light-shielding film 530, and the second insulating layer 522 and allows exposure of the contact wiring layer 83.

Furthermore, as shown in FIG. 14H, the opening 597 is filled with a conductive material such as tungsten to form the contact 73.

According to the first forming method described above, the contact wiring layer 83 wired on the element isolation layer 513 from the floating diffusion region 72 can be formed by a smaller number of steps.

(Second Forming Method)

A second forming method of the contact wiring layer 83 shown in FIG. 12 will be subsequently described with reference to FIGS. 15A to 15F. FIGS. 15A to 15F are longitudinal cross-sectional views explaining respective steps of the second forming method of the contact wiring layer 83. The second forming method is a method which separately and sequentially forms the contact wiring layer 83 and the gate electrode 63.

Initially, as shown in FIG. 15A, the first insulating layer 521 and the silicon layer 585 are sequentially formed on the semiconductor substrate 51 where the element isolation layer 513 and the floating diffusion region 72 are provided.

Thereafter, as shown in FIG. 15B, the silicon layer 585 in a region other than the region corresponding to the gate electrode 63 is removed by etching using a patterned resist 601.

Subsequently, as shown in FIG. 15C, the resist 601 is removed, and then an insulating layer is formed on the semiconductor substrate 51 and the gate electrode 63. As a result, the first insulating layer 521 is formed on the semiconductor substrate 51, and the second insulating layer 522 is formed on the gate electrode 63.

Thereafter, as shown in FIG. 15D, an opening 603 for producing the plug 580 is formed in the first insulating layer 521 by etching using a patterned resist.

Subsequently, as shown in FIG. 15E, a silicon layer 605 is formed on the first insulating layer 521 and the second insulating layer 522. As a result, the opening 603 formed in the first insulating layer 521 is filled with silicon to produce the plug 580.

Thereafter, as shown in FIG. 15F, the silicon layer 605 in a region other than the region corresponding to the contact wiring layer 83 is removed by etching using a patterned resist 606. In this manner, similarly to the step shown in FIG. 14C, a layer including polysilicon can be formed in a region corresponding to the contact wiring layer 83 and the gate electrode 63.

Therefore, the contact wiring layer 83 wired on the element isolation layer 513 from the floating diffusion region 72 can be formed by performing the steps similar to the steps shown in FIGS. 14D to 14H after removal of the second insulating layer 522 provided on the gate electrode 63.

According to the second forming method described above, each of the contact wiring layer 83 and the gate electrode 63 can be formed under process conditions suitable for each of the contact wiring layer 83 and the gate electrode 63.

(3.4. Modifications)

Modifications of the imaging device according to the present embodiment will be subsequently described with reference to FIGS. 16 to 18. The technology according to the present embodiment is applicable to devices other than the imaging device including the pixel 2 shown in FIG. 11. Each of FIGS. 16 to 18 is a longitudinal cross-sectional view showing an example of an imaging device to which the technology according to the present embodiment is applicable.

For example, as shown in FIGS. 16 and 17, the technology according to the present embodiment is also applicable to a backside illumination type imaging device. Each of FIGS. 16 and 17 is a longitudinal cross-sectional view schematically showing a configuration of the backside illumination type imaging device.

According to the backside illumination type imaging device, as shown in FIGS. 16 and 17, a photoelectric conversion portion 770 as a photodiode is formed by providing a second conductivity type (for example, n-type) region 770A inside a first conductivity type (for example, p-type) silicon substrate 710, and providing a first conductivity type (for example, p-type) region 770B in a region on the side where a multilayer wiring layer 723 is provided.

A pixel defining film 733 for defining pixels, a color filter 744, and an on-chip lens 745 are provided on the light receiving surface side (also referred to as the back side) of the silicon substrate 710 with insulating layers 741 and 743 interposed between the silicon substrate 710 and the pixel defining film 733, the color filter 744, and the on-chip lens 745.

Moreover, a transfer gate 761 for extracting accumulated charge from the photoelectric conversion portion 770 is provided on the side (also referred to as the front side) opposite to the light receiving surface side with respect to the silicon substrate 710. The charge extracted from the photoelectric conversion portion 770 by the transfer gate 761 is accumulated in the floating diffusion region 711 provided on the front side of the silicon substrate 710. Furthermore, a light-shielding film 730 is provided on the multilayer wiring layer 723 provided on the side opposite to the light receiving surface side with respect to the silicon substrate 710 to shield reflection light coming from a wiring layer 777 or the like included in the multilayer wiring layer 723.

A contact 773 electrically connected to the floating diffusion region 711 via a contact wiring layer 783 is provided on the element isolation layer 713. Note that the charge extracted from the floating diffusion region 711 by the contact wiring layer 783 and the contact 773 is output via the wiring layer 777 and the like to a not-shown reading circuit which converts the charge into a pixel signal.

As shown in FIG. 16, there is a possibility herein that an opening is produced in the light-shielding film 730 from a viewpoint of layout or processing. In addition, as shown in FIG. 17, there is a possibility that the light-shielding film 730 has an opening through which a contact electrically connected to the silicon substrate 710, such as a well contact 779, passes. According to the technology of the present embodiment, entrance of light into the floating diffusion region 711 from the multilayer wiring layer 723 side by reflection on the wiring layer 777 can be suppressed after the light passes through the opening thus produced in the light-shielding film 730 configured as above.

Moreover, as shown in FIG. 18, the technology according to the present embodiment is also applicable to a backside illumination type imaging device which implements a global shutter operation. FIG. 18 is a longitudinal cross-sectional view schematically showing a configuration of a backside illumination type imaging device which implements a global shutter operation.

According to the backside illumination type imaging device which implements a global shutter operation, as shown in FIG. 18, a charge holding portion 732 including a first conductivity type region 732A and a second conductivity type region 732B is provided instead of the floating diffusion region 711 of the backside illumination type imaging device shown in FIGS. 16 and 17. Moreover, a light-shielding structure 734 including tungsten or the like is provided on the light receiving surface side of the charge holding portion 732 and so formed as to cover the charge holding portion 732 to shield direct entrance of light into the charge holding portion 732.

Even in a case of the backside illumination type imaging device which implements a global shutter operation, as shown in FIG. 18, there is a possibility that light having passed through the photoelectric conversion portion 770 further passes through the opening of the light-shielding film 730, and enters the silicon substrate 710 from the multilayer wiring layer 723 side. According to the technology according to the present embodiment, entrance of light into the charge holding portion 732 by reflection on the wiring layer 777 is suppressed after the light passes through the opening of the light-shielding film 730 and enters the multilayer wiring layer 723.

4. Application Examples

Described hereinafter with reference to FIGS. 19 to 24 will be application examples of the imaging device according to the first or second embodiment of the present disclosure.

(Application to Imaging System)

Figure 19:
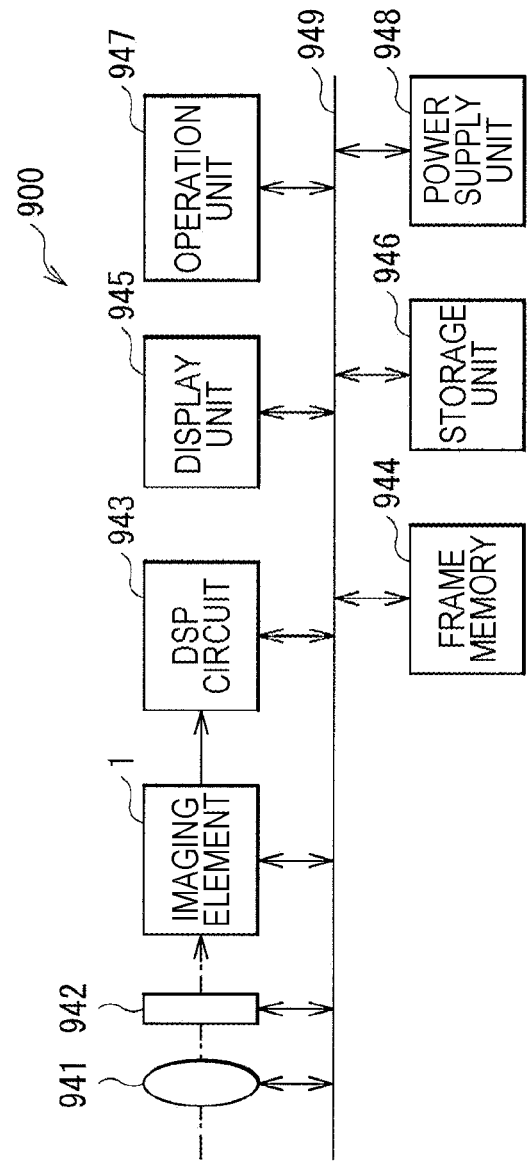
FIG. 19 is a block diagram showing an example of a schematic configuration of an imaging system including the imaging device according to the first or second embodiment of the present disclosure.

Described initially with reference to FIGS. 19 and 20 will be an application example which applies the imaging device according to the first or second embodiment of the present disclosure to an imaging system. FIG. 19 is a block diagram showing an example of a schematic configuration of an imaging system 900 including the imaging device 1 according to the first or second embodiment of the present disclosure. FIG. 20 illustrates an example of a flowchart of an imaging operation performed by the imaging system 900.

For example, as shown in FIG. 19, the imaging system 900 is an electronic device such as a digital still camera, a video camera, and other imaging devices, and a smartphone, a tablet terminal, and other portable terminal devices.

For example, the imaging system 900 includes a lens group 941, a shutter 942, the imaging device 1 according to the first or second embodiment of the present disclosure, a DSP circuit 943, a frame memory 944, a display unit 945, a storage unit 946, an operation unit 947, and a power supply unit 948. In the imaging system 900, the imaging device 1, the DSP circuit 943, the frame memory 944, the display unit 945, the storage unit 946, the operation unit 947, and the power supply unit 948 are mutually connected via a bus line 949.

The imaging device 1 outputs image data corresponding to incident light having passed through the lens group 941 and the shutter 942. The DSP circuit 943 is a signal processing circuit, and processes a signal (i.e., image data) output from the imaging device 1. The frame memory 944 temporarily holds image data processed by the DSP circuit 943 in units of frame. The display unit 945 is a panel-type display device such as a liquid crystal panel and an organic electro luminescence (EL) panel, for example, and displays a moving image or a still image captured by the imaging device 1. The storage unit 946 includes a recording medium such as a semiconductor memory and a hard disk, and records image data indicating a moving image or a still image captured by the imaging device 1. The operation unit 947 outputs operation commands associated with various functions of the imaging system 900 on the basis of an operation performed by the user. The power supply unit 948 is a power supply of various types for supplying operation power to the imaging device 1, the DSP circuit 943, the frame memory 944, the display unit 945, the storage unit 946, and the operation unit 947.

Described next will be an imaging procedure performed by the imaging system 900.

As shown in FIG. 20, the user operates the operation unit 947 to command a start of imaging (S101). In response to this operation, the operation unit 947 transmits an imaging command to the imaging device 1 (S102). Upon receiving the imaging command, the imaging device 1 executes imaging using a predetermined imaging method (S103).

Thereafter, the imaging device 1 outputs the captured image data to the DSP circuit 943. The DSP circuit 943 performs predetermined signal processing (for example, noise reduction processing) for the image data output from the imaging device 1 (S104). The DSP circuit 943 causes the frame memory 944 to hold the image data subjected to the predetermined signal processing. Thereafter, the frame memory 944 stores the image data in the storage unit 946 (S105). The imaging system 900 performs imaging in this manner.

According to the present application example, the imaging device 1 of the first or second embodiment of the present disclosure is applied to the imaging system 900. According to the technology of the present disclosure, noise caused by reflection light inside the imaging device 1 or crosstalk between the adjacent pixels 2 can be further suppressed. Therefore, according to the technology of the present disclosure, the imaging system 900 is capable of capturing a higher-quality image.

(Application to Moving Body Control System)

The technology according to the present disclosure (present technology) is applicable to various products. For example, the technology according to the present disclosure may be implemented as a device mounted on any type of moving body such as an automobile, an electric vehicle, a hybrid electric vehicle, a motorcycle, a bicycle, personal mobility, an airplane, a drone, a ship, and a robot.

FIG. 21 is a block diagram showing a schematic configuration example of a vehicle control system as an example of a moving body control system to which the technology according to the present disclosure is applicable.

A vehicle control system 12000 includes a plurality of electronic control units connected via a communication network 12001. In the example shown in FIG. 21, the vehicle control system 12000 includes a drive system control unit 12010, a body system control unit 12020, an outside-vehicle information detection unit 12030, an in-vehicle information detection unit 12040, and an integrated control unit 12050. Furthermore, as a functional configuration of the integrated control unit 12050, a microcomputer 12051, an audio image output unit 12052, and an in-vehicle network interface (I/F) 12053 are shown in the figure.

The drive system control unit 12010 controls operations of devices associated with the drive system of a vehicle under various programs. For example, the drive system control unit 12010 functions as a control device such as an internal combustion engine, a driving motor, and other driving force generators for generating a driving force of the vehicle, a driving force transmission mechanism for transmitting the driving force to wheels, a steering mechanism which controls a steering angle of the vehicle, and a braking device which generates a braking force of the vehicle.

The body system control unit 12020 controls operations of various devices equipped on a vehicle body under various programs. For example, the body system control unit 12020 functions as a keyless entry system, a smart key system, a power window device, or a control device for various lamps such as a headlamp, a back lamp, a brake lamp, a direction indicator, and a fog lamp. In this case, radio waves transmitted from a portable device substituted for a key, or signals from various switches may be input to the body system control unit 12020. The body system control unit 12020 receives input of these radio waves or signals, and controls a door lock device, a power window device, a lamp, and the like of the vehicle.

The outside-vehicle information detection unit 12030 detects external information outside the vehicle carrying the vehicle control system 12000. For example, an imaging unit 12031 is connected to the outside-vehicle information detection unit 12030. The outside-vehicle information detection unit 12030 causes the imaging unit 12031 to capture an image outside the vehicle, and receives the captured image. The outside-vehicle information detection unit 12030 may perform object detection processing for detecting an object such as a person, a car, an obstacle, a sign, and a character on a road surface, or distance detection processing on the basis of the received image.

The imaging unit 12031 is an optical sensor which receives light and outputs an electric signal corresponding to an amount of received light. The imaging unit 12031 is capable of outputting an electric signal as an image, or outputting the electric signal as distance measurement information. In addition, the light received by the imaging unit 12031 may be visible light, or invisible light such as infrared light.

The in-vehicle information detection unit 12040 detects in-vehicle information inside the vehicle. For example, a driver state detection unit 12041 which detects a state of a driver is connected to the in-vehicle information detection unit 12040. The driver state detection unit 12041 may include a camera which images the driver, for example. In this case, the in-vehicle information detection unit 12040 may calculate a degree of fatigue or a degree of concentration of the driver, or determine whether the driver is drowsing on the basis of detection information input from the driver state detection unit 12041.

The microcomputer 12051 is capable of calculating a control target value of the driving force generator, the steering mechanism, or the braking device on the basis of in- or outside-vehicle information acquired by the outside-vehicle information detection unit 12030 or the in-vehicle information detection unit 12040, and outputting a control command to the drive system control unit 12010. For example, the microcomputer 12051 is capable of performing cooperative control for the purpose of achieving advanced driver assistance system (ADAS) functions including collision avoidance or shock mitigation of the vehicle, tracking based on an inter-vehicle distance, speed maintenance traveling, vehicle collision warning, a vehicle lane departure warning, and the like.

Moreover, the microcomputer 12051 is capable of controlling the driving force generator, the steering mechanism, the braking device, or the like on the basis of information associated with surroundings of the vehicle and acquired by the outside-vehicle information detection unit 12030 or the in-vehicle information detection unit 12040 to perform cooperative control for the purpose of automatic driving achieving autonomous traveling without an operation by the driver, for example.

Furthermore, the microcomputer 12051 is capable of outputting a control command to the body system control unit 12020 on the basis of external information associated with the outside of the vehicle and acquired by the outside-vehicle information detection unit 12030. For example, the microcomputer 12051 is capable of controlling the headlamp according to a position of a preceding vehicle or an oncoming vehicle detected by the outside-vehicle information detection unit 12030 to perform cooperative control for the purpose of preventing glare, such as switching from a high beam to a low beam.

The audio image output unit 12052 transmits at least either an audio output signal or an image output signal to an output device capable of issuing a visual or audible notification of information to a vehicle occupant or outside the vehicle. FIGS. 15A to 15F show an audio speaker 12061, a display unit 12062, and an instrument panel 12063 as examples of output devices. The display unit 12062 may include at least one of an onboard display or a head-up display, for example.

FIG. 22 is a diagram showing an example of an installation position of the imaging unit 12031.

In FIG. 22, the vehicle 12100 includes imaging units 12101, 12102, 12103, 12104, and 12105 as the imaging unit 12031.

For example, the imaging units 12101, 12102, 12103, 12104, 12105 are provided at positions such as a front nose, a side mirror, a rear bumper, a back door, and an upper part of a windshield in a vehicle compartment of the vehicle 12100. Each of the imaging unit 12101 provided on the front nose and the imaging unit 12105 provided on the upper part of the windshield in the vehicle compartment mainly acquires an image in front of the vehicle 12100. Each of the imaging units 12102 and 12103 provided on the side mirrors mainly acquires an image of the side of the vehicle 12100. The imaging unit 12104 provided on the rear bumper or the back door mainly acquires an image behind the vehicle 12100. The front images acquired by the imaging units 12101 and 12105 are mainly used for detecting a preceding vehicle or a pedestrian, an obstacle, a traffic light, a traffic sign, a lane, or the like.

Note that FIG. 22 shows an example of imaging ranges of the imaging units 12101 to 12104. An imaging range 12111 indicates an imaging range of the imaging unit 12101 provided on the front nose, imaging ranges 12112 and 12113 indicate imaging ranges of the imaging units 12102 and 12103 provided on the side mirrors, respectively, and an imaging range 12114 indicates an imaging range of the imaging unit 12104 provided on the rear bumper or the back door. For example, an overhead image of the vehicle 12100 as viewed from above is obtained by superimposing image data captured by the imaging units 12101 to 12104.

At least one of the imaging units 12101 to 12104 may have a function of acquiring distance information. For example, at least one of the imaging units 12101 to 12104 may be a stereo camera including a plurality of imaging elements, or may be an imaging element having pixels for phase difference detection.

For example, the microcomputer 12051 is capable of extracting, as a preceding vehicle, a three-dimensional object traveling at a predetermined speed (for example, 0 km/h or more) substantially in the same direction as that of the vehicle 12100 and particularly the closest on a traveling path of the vehicle 12100 by obtaining distances to respective three-dimensional objects within the imaging ranges 12111 to 12114 and changes of these distances with time (speeds relative to the speed of the vehicle 12100) on the basis of distance information obtained from the imaging units 12101 to 12104. Moreover, the microcomputer 12051 is capable of setting an inter-vehicle distance to be secured ahead between the vehicle and the preceding vehicle beforehand, and performing automatic brake control (including following stop control), automatic acceleration control (including following start control), and the like. In this manner, cooperative control is achievable for the purpose of autonomous driving or the like performing autonomously traveling without operation by the driver.

For example, the microcomputer 12051 classifies three-dimensional object data associated with a three-dimensional object into a two-wheeled vehicle, an ordinary vehicle, a large vehicle, a pedestrian, and another three-dimensional object such as a power pole on the basis of distance information obtained from the imaging units 12101 to 12104, and extracts the classified data to use the data for automatic avoidance of obstacles. For example, the microcomputer 12051 classifies obstacles around the vehicle 12100 into obstacles visible to the driver of the vehicle 12100 and obstacles difficult to visually recognize by the driver. Then, the microcomputer 12051 determines a collision risk indicating a danger level of collision with respective obstacles, and outputs an alarm to the driver via the audio speaker 12061 or the display unit 12062, or performs forced deceleration or avoidance steering using the drive system control unit 12010 to achieve driving assistance for collision avoidance when the collision risk is equal to or higher than a set value in a situation of a possibility of collision.

At least one of the imaging units 12101 to 12104 may be an infrared camera which detects infrared light. For example, the microcomputer 12051 is capable of recognizing a pedestrian by determining whether or not a pedestrian is present in captured images of the imaging units 12101 to 12104. For example, this pedestrian recognition is achieved by a procedure for extracting feature points in the captured images of the imaging units 12101 to 12104 as infrared cameras, and a procedure for performing a pattern matching for a series of feature points indicating a contour of an object to determine whether or not the object is a pedestrian. When the microcomputer 12051 determines that a pedestrian is present in the captured images of the imaging units 12101 to 12104 and recognizes the pedestrian, the audio image output unit 12052 controls the display unit 12062 such that a square contour line for emphasis is superimposed on the recognized pedestrian for superimposed display. In addition, the audio image output unit 12052 may control the display unit 12062 such that an icon or the like indicating a pedestrian is displayed at a desired position.

The example of the moving body control system to which the technology according to the present disclosure is applicable has been described above. The technology according to the present disclosure is applicable to the imaging unit 12031 included in the configuration described above. According to the technology of the present disclosure, higher-quality images can be captured. Therefore, highly accurate control using captured images is achievable by the moving body control system.

(Application to Endoscopic Surgery System)

FIG. 23 is a diagram showing an example of a schematic configuration of an endoscopic surgery system to which the technology according to the present disclosure (present technology) is applicable.

FIG. 23 shows a state where an operator (doctor) 11131 is performing a surgery on a patient 11132 lying on a patient bed 11133 using an endoscopic surgery system 11000. As shown in the figure, the endoscopic surgery system 11000 includes an endoscope 11100, other surgical tools 11110 such as a pneumoperitoneum tube 11111 and an energy treatment tool 11112, a support arm device 11120 which supports the endoscope 11100, and a cart 11200 on which various devices for endoscopic surgery are carried.

The endoscope 11100 includes a lens barrel 11101 whose region having a predetermined length from a distal end is inserted into a body cavity of the patient 11132, and a camera head 11102 connected to a proximal end of the lens barrel 11101. While the figure shows an example where the endoscope 11100 is configured as a so-called rigid endoscope which includes the lens barrel 11101 having rigidity, the endoscope 11100 may be configured as a so-called flexible endoscope having a flexible lens barrel.

An opening into which an objective lens is fitted is provided at the distal end of the lens barrel 11101. A light source device 11203 is connected to the endoscope 11100. Light generated by the light source device 11203 is guided to the distal end of the lens barrel by a light guide extended inside the lens barrel 11101, and emitted to an observation target in the body cavity of the patient 11132 via the objective lens. Note that the endoscope 11100 may be either a forward-viewing endoscope, or an oblique-viewing endoscope or a side-viewing endoscope.

An optical system and an imaging element are provided inside the camera head 11102. Reflection light (observation light) from an observation target is concentrated on the imaging element by the optical system. Observation light is photoelectrically converted by the imaging element, and an electric signal corresponding to the observation light, that is, an image signal corresponding to the observation image is generated. This image signal is transmitted to a camera control unit (CCU) 11201 as RAW data.

The CCU 11201 includes a central processing unit (CPU), a graphics processing unit (GPU), and the like, and integrally controls operations of the endoscope 11100 and a display device 11202. Moreover, the CCU 11201 receives an image signal from the camera head 11102, and performs various image processes, such as a development process (demosaicing process), for the image signal to display an image based on the image signal.

The display device 11202 displays an image based on the image signal subjected to image processing by the CCU 11201 under the control by the CCU 11201.

The light source device 11203 includes a light source such as a light emitting diode (LED), for example, and supplies irradiation light to the endoscope 11100 at the time of imaging a surgical site or the like.

An input device 11204 is an input interface for the endoscopic surgery system 11000. The user can input various types of information and instructions to the endoscopic surgery system 11000 via the input device 11204. For example, the user inputs an instruction or the like to change conditions of imaging by the endoscope 11100 (type of irradiation light, magnification, focal length, and the like).

A treatment tool control device 11205 controls driving of the energy treatment tool 11112 for tissue ablation, incision, blood vessel sealing, or the like. A pneumoperitoneum device 11206 sends gas into the body cavity of the patient 11132 via the pneumoperitoneum tube 11111 to inflate the body cavity for the purpose of securing a visual field of the endoscope 11100 and securing a work space of the operator. A recorder 11207 is a device capable of recording various types of information associated with a surgery. A printer 11208 is a device capable of printing various types of information associated with a surgery in various formats such as text, images, or graphs.

Note that the light source device 11203 which supplies irradiation light to the endoscope 11100 at the time of imaging of the surgical site may include an LED, a laser light source, or a white light source including a combination of the LED and the laser light source, for example. In a case where the white light source including a combination of RGB laser light sources is used, output intensities and output timing of respective colors (respective wavelengths) can be controlled with high accuracy. Accordingly, white balance adjustment of captured images is achievable by the light source device 11203. Furthermore, in this case, images corresponding to respective RGB can be also captured in a time sharing manner by irradiating an observation target with laser lights from the respective RGB laser light sources in a time-sharing manner, and controlling driving of the imaging element of the camera head 11102 in synchronization with the irradiation timing. According to this method, a color image can be obtained without the necessity of a color filter provided on the imaging element.

Moreover, driving of the light source device 11203 may be controlled such that intensity of output light changes at predetermined time intervals. An image in a high-dynamic range including no so-called blackout and overexposure can be formed by acquiring images in a time-sharing manner under driving control of the imaging element of the camera head 11102 in synchronization with change timing of the intensity of the light, and synthesizing the acquired images.

Furthermore, the light source device 11203 may be configured to supply light in a predetermined wavelength band corresponding to special light observation. For example, the special light observation is achieved by so-called narrow band imaging which images a predetermined tissue such as a blood vessel in a superficial portion of the mucous membrane with high contrast by emitting light in a narrower band than the band of irradiation light during normal observation (i.e., white light) while utilizing wavelength dependence of light absorption in a body tissue. Alternatively, the special light observation may be achieved by fluorescence observation which obtains an image using fluorescence generated by emitting excitation light. For example, the fluorescence observation may be performed by irradiating a body tissue with excitation light and observing fluorescence coming from the body tissue (autofluorescence observation), or by locally injecting a reagent such as indocyanine green (ICG) into the body tissue and irradiating the body tissue with excitation light corresponding to a fluorescence wavelength of the reagent to obtain a fluorescence image. The light source device 11203 may be configured to supply narrow-band light and/or excitation light corresponding to such special light observation.

FIG. 24 is a block diagram showing an example of functional configurations of the camera head 11102 and the CCU 11201 shown in FIG. 23.

The camera head 11102 includes a lens unit 11401, an imaging unit 11402, a driving unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system provided at a connection portion with the lens barrel 11101. Observation light taken from a distal end of the lens barrel 11101 is guided to the camera head 11102, and enters the lens unit 11401. The lens unit 11401 includes a combination of a plurality of lenses including a zoom lens and a focus lens.

The imaging unit 11402 includes an imaging element. The imaging unit 11402 may include the one imaging element (so-called single-plate type) or a plurality of imaging elements (so-called multi-plate type). In a case where the imaging unit 11402 is the multi-plate type, image signals corresponding to respective RGB may be generated by respective imaging elements, and combined to obtain a color image, for example. Alternatively, the imaging unit 11402 may include a pair of imaging elements for acquiring right-eye and left-eye image signals corresponding to three-dimensional (3D) display. The operator 11131 can more accurately recognize a depth of a living tissue in a surgical site by performing 3D display. Note that a plurality of systems of the lens units 11401 may be provided in correspondence with the respective imaging elements in a case where the imaging unit 11402 is the multi-plate type.

Furthermore, the imaging unit 11402 is not necessarily disposed on the camera head 11102. For example, the imaging unit 11402 may be provided inside the lens barrel 11101 immediately behind the objective lens.

The driving unit 11403 includes an actuator, and moves the zoom lens and the focus lens of the lens unit 11401 by a predetermined distance along an optical axis under control by the camera head control unit 11405. In this manner, a magnification and a focus of an image captured by the imaging unit 11402 is appropriately adjustable.

The communication unit 11404 includes a communication device for transmitting and receiving various types of information to and from the CCU 11201. The communication unit 11404 transmits an image signal obtained from the imaging unit 11402 as RAW data to the CCU 11201 via the transmission cable 11400.

In addition, the communication unit 11404 receives a control signal for controlling driving of the camera head 11102 from the CCU 11201, and supplies the control signal to the camera head control unit 11405. For example, the control signal includes information associated with imaging conditions, i.e., information for specifying a frame rate of a captured image, information for specifying an exposure value during imaging, and/or information for specifying a magnification and a focus of a captured image.

Note that the imaging conditions described above, such as the frame rate, the exposure value, the magnification, and the focus, may be appropriately specified by the user, or may be automatically set by the control unit 11413 of the CCU 11201 on the basis of an acquired image signal. In the latter case, the endoscope 11100 has so-called auto exposure (AE) function, auto focus (AF) function, and auto white balance (AWB) function.

The camera head control unit 11405 controls driving of the camera head 11102 on the basis of a control signal from the CCU 11201 received via the communication unit 11404.

The communication unit 11411 includes a communication device for transmitting and receiving various types of information to and from the camera head 11102. The communication unit 11411 receives an image signal transmitted from the camera head 11102 via the transmission cable 11400.

Moreover, the communication unit 11411 transmits a control signal for controlling driving of the camera head 11102 to the camera head 11102. An image signal and a control signal can be transmitted by electric communication, optical communication, or the like.

The image processing unit 11412 performs various types of image processing for an image signal which is RAW data transmitted from the camera head 11102.

The control unit 11413 performs various types of control associated with imaging of a surgical site or the like by the endoscope 11100, and display of an image captured by imaging of a surgical site or the like. For example, the control unit 11413 generates a control signal for controlling driving of the camera head 11102.

In addition, the control unit 11413 causes the display device 11202 to display a captured image where a surgical site or the like is shown on the basis of an image signal subjected to image processing by the image processing unit 11412. At this time, the control unit 11413 may recognize various objects in the captured image using various image recognition techniques. For example, the control unit 11413 can recognize surgical tools such as forceps, a specific portion of a living body, bleeding, mist during use of the energy treatment tool 11112, and the like by detecting an edge shape, a color, or the like of an object included in a captured image. During display of a captured image on the display device 11202, the control unit 11413 may superimpose various types of surgery support information on the image of the surgical site using a result of the recognition. Reduction of a burden on the operator 11131 and secure advancement of surgery by the operator 11131 are achievable by superimposing the surgery support information and presenting the superimposed display to the operator 11131.

The transmission cable 11400 which connects the camera head 11102 and the CCU 11201 is an electric signal cable corresponding to electric signal communication, an optical fiber corresponding to optical communication, or a composite cable of these cables.

While the example in the figure herein shows wired communication using the transmission cable 11400, communication between the camera head 11102 and the CCU 11201 may be wirelessly performed.

The example of the endoscopic surgery system to which the technology according to the present disclosure is applicable has been described above. The technology according to the present disclosure is suitably applicable to the imaging unit 11402 provided on the camera head 11102 of the endoscope 11100 in the configurations described above. According to the technology of the present disclosure, image quality of images captured by the imaging unit 11402 can further improve. Therefore, visibility and operability of a user using the endoscopic surgery system can improve.

The technology according to the present disclosure has been described herein while presenting the first and second embodiments and the modifications. However, the technology according to the present disclosure is not limited to the above-described embodiments and the like, but includes various modifications.

Moreover, the above-described first and second embodiments and modifications may be combined with each other.

Furthermore, all of the configurations and operations described in the respective embodiments are not necessary as configurations and operations of the present disclosure. For example, it should be understood that constituent elements included in constituent elements of the respective embodiments and not described in the independent claims defining the highest concept of the present disclosure are optional constituent elements.

Terms used throughout the present description and the appended claims should be interpreted as "non-limiting" terms. For example, the terms "include" or "be included" should be interpreted as "not limited to what is described as included". The term "include" should be interpreted as "not limited to what is described as included".

The terms used in the present description are terms used merely for convenience of description, and include terms not limiting configurations and operations. For example, terms such as "right", "left", "up", and "down" merely indicate directions in the referenced figures. In addition, terms "inside" and "outside" indicate a direction toward a center of an element of interest, and a direction away from the center of the element of interest, respectively. The same applies to terms similar to these terms and terms for similar purposes.

Note that the technology according to the present disclosure may have following configurations. According to the technology of the present disclosure having the following configurations, entrance of reflection light inside the imaging device into the photoelectric conversion portion, the charge holding portion, the floating diffusion region, or the like can be further suppressed. Therefore, the imaging device to which the technology according to the present disclosure is applied can further suppress generation of noise in a pixel signal. Advantages to be offered by the technology according to the present disclosure are not limited to the advantages described herein, but may be any of advantages described in the present disclosure.

(1)

An imaging device including:

a semiconductor substrate that includes a photoelectric conversion portion configured to photoelectrically convert incident light, or a charge holding portion configured to hold charge photoelectrically converted by the photoelectric conversion portion;

a field effect transistor provided on the photoelectric conversion portion, or on the semiconductor substrate near the charge holding portion;

a contact plug that extends in a direction normal to one main surface of the semiconductor substrate from a gate electrode of the field effect transistor; and a projecting portion that extends in an in-plane direction of the one main surface of the semiconductor substrate from the contact plug.

(2)

The imaging device according to (1) described above, further including
- a light-shielding film provided on one main surface of the semiconductor substrate on a side opposite to a surface of the semiconductor substrate to which the incident light enters, in which the light-shielding film includes an opening corresponding to the contact plug.

(3)

The imaging device according to (2) described above, in which the projecting portion is provided so as to cover the opening provided in the light-shielding film.

(4)

The imaging device according to (3) described above, in which a part of a region where the projecting portion is formed overlaps a region where the light-shielding film is formed in a plan view of the one main surface of the semiconductor substrate.

(5)

The imaging device according to any one of (2) to (4) described above, in which the projecting portion is provided either above or below the light-shielding film.

(6)

The imaging device according to any one of (1) to (5) described above, in which the field effect transistor is a field effect transistor that controls transfer of charge from the photoelectric conversion portion or the charge holding portion.

(7)

The imaging device according to any one of (1) to (5) described above,
- in which a plurality of pixels each including the photoelectric conversion portion is arranged on the semiconductor substrate, and
- the field effect transistor is a field effect transistor provided between the pixels isolated from each other.

(8)

An imaging device including:
- a semiconductor substrate that includes a photoelectric conversion portion configured to photoelectrically convert incident light, a charge holding portion configured to accumulate charge photoelectrically converted by the photoelectric conversion portion, and a reading circuit configured to read the charge;
- a light-shielding layer provided on one main surface of the semiconductor substrate;
- a contact that penetrates the light-shielding layer and extends in a direction normal to the one main surface of the semiconductor substrate; and
- a contact wiring layer that electrically connects the contact and a source or a drain of a field effect transistor provided on the semiconductor substrate,
- in which the one main surface of the semiconductor substrate includes a charge accumulation region that includes at least the photoelectric conversion portion and the charge holding portion, and a non-charge accumulation region that includes the reading circuit, and
- the contact wiring layer extends to the non-charge accumulation region, and is electrically connected to the contact in the non-charge accumulation region.

(9)

The imaging device according to (8) described above,
- in which an element isolation layer is further provided on the semiconductor substrate in the non-charge accumulation region, and
- the contact wiring layer is electrically connected to the contact on the element isolation layer.

(10)

The imaging device according to (8) or (9) described above, in which the light-shielding layer is provided in a region of the one main surface of the semiconductor substrate except for a region corresponding to the photoelectric conversion portion.

(11)

The imaging device according to any one of (8) to (10) described above, in which the contact wiring layer includes polysilicon that contains a conductive impurity.

(12)

The imaging device according to (11) described above, in which a silicide layer is further provided on the contact wiring layer at a connection portion with the contact.

(13)

The imaging device according to any one of (8) to (12) described above, in which the incident light enters the photoelectric conversion portion from a side where the light-shielding layer is provided.

(14)

The imaging device according to any one of (8) to (12) described above, in which the incident light enters the photoelectric conversion portion from a side where the light-shielding layer is provided.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

1 Imaging device
2 Pixel
3 Pixel array unit
4 Vertical driving circuit
5 Column signal processing circuit
6 Horizontal driving circuit
7 Output circuit
8 Control circuit
10 Pixel drive wiring
11 Horizontal signal line
20 Multilayer wiring layer
21 Wiring layer
22 Interlayer insulating layer
23, 26 Contact plug
24 Wiring light-shielding film
24A Opening
25 Gate electrode
27 Projecting portion
30 Semiconductor substrate
31 Photoelectric conversion portion
32 Charge holding portion
33 Light-shielding structure
33A First light-shielding film
33B Second light-shielding film
33C Third light-shielding film
34 Floating diffusion region
41 Interlayer insulating layer
42 Sub on-chip lens
43 Planarization film
44 Color filter layer
45 Main on-chip lens
46 Pixel isolation structure
46A Pixel insulating film 46B Pixel defining film
51 Semiconductor substrate
61, 62, 63, 64, 65, 66 Gate electrode
70 Photoelectric conversion portion
71 Charge holding portion
72 Floating diffusion region
73, 74, 75, 77 Contact
76 Charge discharging portion
83, 84, 85, 86 Contact wiring layer

What is claimed is:

1. An imaging device, comprising:
a semiconductor substrate that includes a photoelectric conversion portion configured to photoelectrically convert incident light, or a charge holding portion configured to hold charge photoelectrically converted by the photoelectric conversion portion;
a field effect transistor provided on the photoelectric conversion portion, or on the semiconductor substrate near the charge holding portion;
a contact plug that extends in a direction normal to one main surface of the semiconductor substrate from a gate electrode of the field effect transistor;
a projecting portion that extends in an in-plane direction of the one main surface of the semiconductor substrate from the contact plug,
wherein the projecting portion has vertical section and a horizontal section; and
a light-shielding film provided on the one main surface of the semiconductor substrate on a side opposite to a surface of the semiconductor substrate to which the incident light enters,
wherein the projecting portion is provided below the light-shielding film and between the gate electrode of the field effect transistor and the contact plug, and
wherein a width of the horizontal section of the projecting portion is greater than a width of the contact plug.

2. The imaging device according to claim 1, wherein the light-shielding film includes an opening corresponding to the contact plug.

3. The imaging device according to claim 2, wherein the projecting portion is provided so as to cover the opening provided in the light-shielding film.

4. The imaging device according to claim 3, wherein a part of a region where the projecting portion is formed overlaps a region where the light-shielding film is formed in a cross-sectional view of the one main surface of the semiconductor substrate.

5. The imaging device according to claim 1, wherein the field effect transistor is a field effect transistor that controls transfer of charge from the photoelectric conversion portion or the charge holding portion.

6. The imaging device according to claim 1,
wherein a plurality of pixels each including the photoelectric conversion portion is arranged on the semiconductor substrate, and
the field effect transistor is a field effect transistor provided between the pixels isolated from each other.

7. The imaging device according to claim 1, wherein the gate electrode includes polysilicon.

8. The imaging device according to claim 1, wherein the gate electrode includes a flat portion provided on the main surface of the semiconductor substrate.

9. The imaging device according to claim 8, further comprising a side wall of an insulating film provided on a side surface of the flat portion.

10. The imaging device according to claim 1, further comprising an interlayer insulating layer provided on the surface of the semiconductor substrate to which the incident light enters.

11. The imaging device according to claim 10, wherein the interlayer insulating layer includes silicone.

12. The imaging device according to claim 10, further comprising an on-chip lens provided on the surface of the semiconductor substrate to which the incident light enters.

13. The imaging device according to claim 10, further comprising a pixel isolation structure formed in the interlayer insulating layer.

* * * * *